United States Patent [19]
Tsukada et al.

[11] Patent Number: 5,200,634
[45] Date of Patent: Apr. 6, 1993

[54] THIN FILM PHOTOTRANSISTOR AND PHOTOSENSOR ARRAY USING THE SAME

[75] Inventors: Toshihisa Tsukada, Musashino; Yoshiyuki Kaneko, Hachioji; Hideaki Yamamoto, Tokorozawa; Norio Koike, Suginami; Ken Tsutsui, Nishitama; Haruo Matsumaru, Nishitama; Yasuo Tanaka, Koganei, all of Japan

[73] Assignee: Hitachi, Ltd., Tokyo, Japan

[21] Appl. No.: 803,798

[22] Filed: Dec. 9, 1991

Related U.S. Application Data

[63] Continuation of Ser. No. 414,322, Sep. 29, 1989, abandoned.

[30] Foreign Application Priority Data

Sep. 30, 1988 [JP] Japan .................. 63-244167
Feb. 10, 1989 [JP] Japan .................. 1-29793
Feb. 16, 1989 [JP] Japan .................. 1-35068
Mar. 17, 1989 [JP] Japan .................. 1-63583
Mar. 20, 1989 [JP] Japan .................. 1-66126

[51] Int. Cl.$^5$ .................. H01L 27/01; H01L 27/14; H01L 31/00
[52] U.S. Cl. .................. 257/291; 257/448; 257/459
[58] Field of Search .................. 357/4, 23.7, 2, 30

[56] References Cited

U.S. PATENT DOCUMENTS

| | | | |
|---|---|---|---|
| 4,425,572 | 1/1984 | Takafaji et al. | 357/4 |
| 4,752,814 | 6/1988 | Taan | 357/23.7 |
| 5,083,175 | 1/1992 | Hack et al. | 357/30 |

FOREIGN PATENT DOCUMENTS

| | | | |
|---|---|---|---|
| 39177 | 11/1981 | European Pat. Off. | 357/30 |
| 279638 | 8/1988 | European Pat. Off. | 357/4 |
| 62-30375 | 2/1987 | Japan | 357/4 |
| 61-161257 | 1/1988 | Japan | 357/23.7 |
| 63-226071 | 9/1988 | Japan | 357/23.7 |
| 63-227055 | 9/1988 | Japan | 357/30 |
| 1-12577(A) | 1/1989 | Japan | 357/23.7 |

OTHER PUBLICATIONS

"Hydrogenation of Transistors Fabricated in Polycrystalline-Silicon Films" by Kamins et al. IEEE Aug./1980 pp. 159-161.

Primary Examiner—Andrew J. James
Assistant Examiner—D. Monin
Attorney, Agent, or Firm—Antonelli, Terry, Stout & Kraus

[57] ABSTRACT

A thin film phototransistor is provided having a field effect transistor structure where at least one end of the gate electrode is not overlapped with an electrode neighboring the end. Such a thin film phototransistor has: (1) a function as a photosensor and a switching function; (2) a high input impedance; (3) a voltage control function; and (4) a high photocurrent ON/OFF ratio. This thin film phototransistor can be used independently or together with a thin film transistor for picture elements of a one-dimensional or two-dimensional photosensor array, producing satisfactory results.

52 Claims, 21 Drawing Sheets

THIN FILM PHOTOTRANSISTOR AND PHOTOSENSOR ARRAY USING THE SAME

This application is a continuation of application Ser. No,. 414,322, filed on Sept. 29, 1989 now abandoned.

BACKGROUND OF THE INVENTION

The present invention relates to (1) a phototransistor which can be used as a single photosensor having both switching and amplifying functions as well as an integrated one-dimensional or two-dimensional sensor, (2) a photosensor array using phototransistors, especially a one-dimensional contact photosensor array which is configured so that a lensless sensor, which is lower in price and can be used for facsimile terminal equipment and image scanners, can be produced, and (3) a two-dimensional photosensor which is suited to the image input unit or data reader of a personal computer, word processor, or work station.

Conventional phototransistors, as indicated on page 779 of the VLSI General Dictionary (published by "Science Forum " Mar. 31, 1988, Junichi Nishizawa), basically have the structure of bipolar transistors. Each phototransistor mentioned above has a structure that light is irradiated on the base, and minority carriers are introduced to the base by light.

Japanese Patent Laid-Open 1984-110179 indicates that, for forming a semiconductor device such as a solar cell or photodiode, an "a-Si/metal interface reaction layer" ("a-" means "amorphous") is used as a transparent electrode. Phototransistors formed by the conventional technology, which are basically bipolar transistors, have problems such that (1) it is difficult to improve the light efficiency and directivity, (2) the input impedance is low, and (3) each phototransistor cannot be expanded to a field effect transistor.

A conventional one-dimensional contact photosensor is described in JARECT Vol. 16, 1984, pages 290 to 299. The photosensitive unit employs amorphous silicon (a-Si) photodiodes, which are arranged to form independent islands. An external drive circuit is provided to fetch a photo signal from each diode by scanning the diodes sequentially. An integrated circuit is generally used as an external drive circuit. In addition to the photodiodes mentioned above, thin film transistors using amorphous silicon (a-Si) are often used to provide a switching function.

Another example of a one-dimensional photosensor formed by the conventional technology is a photosensor called a complete contact sensor which requires no lens. This is described, for example, on pages 53 to 56 of the collection of manuscripts for the symposium "How are amorphous silicon devices progressed?" sponsored by Electrophotography Institute (Osaka Scientific Technology Center, May 24, 1985). In this example, the photosensitive unit is comprised of photodiodes. Each diode is provided with a hole at its center to let light pass through it. Light passing through the hole is reflected off of a manuscript and irradiated to the diode unit to be converted to an electric signal.

However, the photosensitive unit of a one-dimensional photosensor by the conventional technology, which uses photodiodes, requires an external drive circuit to be independently provided because of the lack of the switching function, resulting in problems of a complicated configuration and higher price.

The two-dimensional image input unit of a conventional personal computer, word processor, or work station is an input unit using the method of scanning a manuscript by mechanically scanning the one-dimensional image sensor.

The two-dimensional image input unit formed by the conventional technology mentioned above uses both mechanical scanning and electrical scanning, causing limits to miniaturization of the unit, speed up of the reading rate, and color display. For example, as to the reading speed, it takes about 15 sec per sheet of A4 type (about 210 mm by 297 mm) specified by JIS at a resolution of 8 lines/mm. Color display requires mechanical scanning to be repeated three times, and the reading time is increased to more than 3 times and the freedom degree for filter configuration is lost.

SUMMARY OF THE INVENTION

The object of the present invention is to eliminate the difficulties of the prior art mentioned above and to provide phototransistors which have a photosensing and an electrical switching function, a high input impedance, and a voltage control function, to provide a one-dimensional contact photosensor which has a simplified structure and is lower in price and lensless, to provide a two-dimensional photosensor array which allows image input by wholly electronic scanning without using mechanical scanning, or to provide a two-dimensional contact photosensor.

To accomplish the object mentioned above, (1) a phototransistor of the present invention is a thin film transistor comprising a source electrode, a drain electrode, at least one gate electrode, a gate insulating film, and a photosensitive semiconductor layer, and (2) the transistor has such a structure that at least one end (the end in the parallel direction with the drain current) of at least one gate electrode has no overlapped region with the electrode neighboring the end of the gate electrode when it is seen in the perpendicular direction to the semiconductor layer. Each picture element of a photosensor array of the present invention is provided with a thin film phototransistor mentioned above.

DETAILED DESCRIPTION OF THE INVENTION

A thin film phototransistor having the structure mentioned above is a field effect transistor. There are two types of field effect transistors; one is provided with one gate electrode and the other with more than one gate electrode. There are two types in each case; one is the coplanar type with all electrodes formed on the same side of the photosensitive semiconductor layer, and the other is the stagger type with gate electrodes formed on opposite sides of the photosensitive semiconductor layer where the source electrode and the drain electrode are formed. Another type of thin film transistor, which has the function of a field effect transistor, may also be used.

The distance between the source and drain electrodes should be 1 to 60 um. When the distance is less than 1 um, the dark current is increased, and the phototransistor cannot be turned on or off easily. When the distance is more than 60 $\mu$m, the drain current is decreased, and the practical current level cannot be retained easily. The distance between the source and drain electrodes can be set more preferably to 5 to 40 $\mu$m.

As mentioned above, in accordance with the invention when each electrode of a phototransistor of the present invention is projected on a plane in parallel with the photosensitive semiconductor layer (the projection direction is perpendicular to the plane), there is a gap between the projection of at least one end of at least one gate electrode and that of the electrode neighboring the end of the gate electrode. The length (G) of the gap should range from the distance (L) between the source and drain electrodes to 1 μm when the phototransistor is the stagger type. In the case of a field effect transistor, it is structurally impossible that G is larger than L. When G is less than 1 μm, the ratio ($I_{photo}/I_{dark}$) of the drain current when light is irradiated to that when no light is irradiated is unfavorably close to 1. In the case of the coplanar type, the lower limit of G is 1 μm and the upper limit is the difference between L and the gate length.

A conventional photosensor uses an opaque substrate, while a phototransistor of the present invention can be formed on a transparent substrate, such as a glass substrate, because it is a thin film transistor. A transparent substrate is suitable for light irradiation from the substrate side. When such a substrate is used, better saturation characteristics can be obtained.

For a semiconductor film, it is desirable that hydrogenated amorphous silicon (abbreviated to a-Si:H) be used as a semiconductor layer to increase the photosensitivity. Hydrogenated amorphous silicon can be deposited to a thin film by a low temperature process, and is a material suited to produce long and wide devices. The plasma CVD method, which is a typical film forming method, is very suitable for this purpose, that is, for simplification of the phototransistor manufacturing process.

The hydrogen content may be as usual, such as about 10 at%. However, it is not limited to this value.

To increase the photosensitivity, it is preferable that an a-Si:H film, which becomes a photosensitive semiconductor layer, is thick, but that the photocarrier generation region is not too far away from the channel. Therefore, the a-Si:H film thickness ranges preferably from 100 nm to 1 μm, more preferably from 200 nm to 600 nm.

For a photosensitive semiconductor layer, a-SiC:H, a-SiGe:H, a-Ge:H, a-C:H, or Group III-V or II-VI compound semiconductors may be used in addition to a-Si:H. Needless to say, single crystal or polycrystal semiconductors may be used other than amorphous materials.

The material of a gate insulating film may be as usual, and silicon nitride is very suited when a-Si:H is used for a semiconductor layer. Oxide such as silicon dioxide, $Ta_2O_5$, or $Al_2O_3$, or their laminated layer such as SiN-$SiO_2$, $Ta_2O_5$-SiN, or $Al_2O_3$-SiN may be used other than silicon nitride. For the manufacturing process, the dry process, such as the plasma CVD method or the sputtering method, or the wet process, such as the anodic formation method which is a typical one, may be used.

For a substrate, other than a glass substrate, an opaque substrate (for example, a resin-coated metal substrate) may be used when a phototransistor is structured so that light is irradiated from the side opposite to the substrate.

The phototransistor formed on a substrate comprises a gate electrode, a gate insulating film, a photosensitive semiconductor layer, a source electrode and a drain electrode containing ohmic contact layers. The source electrode is a carrier injection electrode, which is generally set to the reference potential (ground potential).

The gate and drain electrodes are set generally to potentials higher than that of the source electrode.

The photosensitive semiconductor layer is a region where a channel layer, on which carriers run, is formed on the interface with the gate insulating film. It is also a region where incident light is irradiated and photocarriers are generated there. Light irradiation from the gate electrode side increases the photocarrier generation probability and provides better phototransistor characteristics. Even if the light is irradiated from the side opposite to the gate electrode, the effect of the present invention can be obtained.

Descriptions of a thin film phototransistor with one gate electrode follow. The phototransistor should be structured so that either between the source and gate electrodes or between the drain and gate electrodes, the gate electrode and the other electrode have no overlapped region.

To improve the saturation characteristics of the phototransistor, it is effectual that the source and gate electrodes have no overlapped region.

The overlapped region, as mentioned above, is an overlapped region when each electrode is projected onto a plane, which is parallel with the semiconductor layer, perpendicularly to the plane (namely, each electrode is viewed perpendicularly to the semiconductor layer).

The gate electrode functions as a voltage control electrode to form a channel on the semiconductor layer. No light is irradiated to the semiconductor layer region overlapped with the gate electrode, hence it functions as an electrical switch.

The semiconductor region, which is not overlapped with both of the source and gate electrodes, is a region where incident light is irradiated and photocarriers are generated. Photocarriers are generated also in the semiconductor region which is overlapped with the source electrode. The two regions are an important area to generate a photocurrent. Carriers generated in the source electrode portion prompt an injection of carriers from the source electrode, and the semiconductor region between the source and gate electrodes determines the photo transistor current level. This gap (G) depends on the device specification, and the optimum value can be selected in accordance with each specification. The value range is as described previously. Next, the thin film phototransistor having a plurality of the gate electrodes will be stated hereunder.

The thin film transistor with one gate electrode mentioned above uses a field effect transistor. It is an effectual technique in this viewpoint. This transistor is featured by that (1) it shows such a good photocurrent ON/OFF ratio as about 300, and (2) it is free of the disadvantages, mentioned previously, of a bipolar transistor, and by that it has a high input impedance and voltage control characteristics.

Several hundreds to a thousand or more phototransistors are required to be integrated, hence it is desired to increase furthermore the photocurrent ON/OFF ratio and to improve the linearity of the γ-characteristics. There are many unsolved problems left.

A thin film phototransistor with more than one electrode of the present invention is a thin film field effect phototransistor which has not only an electrically switching function and an amplifying function but also a higher photocurrent ON/OFF ratio and better γ-characteristics. To improve the photocurrent ON/OFF characteristics, the switching function by voltage, the switching function by light (analog switching function), and the electrically amplifying function, the thin film phototransistor is structured so that one gate electrode is branched to a plurality of electrodes or a plurality of independent gate electrodes are provided. To improve the functions mentioned above, it is desirable to irradiate the light from the gate electrode side. Assuming the light intensity as L, the photocurrent $I_{ph}$ is expressed by the equation $I_{ph} \propto L^{\gamma}$. When the $\gamma$-characteristics are linear the value for $\gamma$ is 1. It is desirable that the value of $\gamma$ os close to 1.

To produce a field effect transistor which has a high input impedance and is of the voltage control type, a stagger type thin film transistor is more suited. There are two types of thin film phototransistors with a plurality of gate electrodes in the present invention; one is a phototransistor in which the gate electrodes are connected together in common (it may be said that a gate electrode is divided into a plurality of branches) and the other is a phototransistor in which the gate electrodes are electrically independent (it may be said that a plurality of independent gate electrodes are provided). In either case, carriers are generated by the light made to be incident through the gap between the gate electrodes. Therefore, in the semiconductor region corresponding to each gate electrode gap, photocarriers are generated by light irradiation. In the semiconductor region which is overlapped with each gate electrode, carriers are generated by the impressed gate voltage. As a result, the electrical control of the drain current can be functionally separated from the optical control thereof. The configuration mentioned above increases the photocurrent ON/OFF ratio. The distance (G) between the gate electrodes should be as described previously.

In the thin film phototransistor with one gate electrode or a plurality of the gate electrodes, mentioned above, of the present invention,. a large portion of the channel region of the phototransistor is covered with the source, drain, and gate electrodes which are opaque, resulting in a low light utilization factor.

To increase the light utilization factor by facilitating light introduction, at least one of the source, drain, and gate electrodes may be made transparent. In this case, light is irradiated also through the transparent electrode (source, drain, or gate), and photocarriers are generated.

When the gate, source, and drain electrodes are to be formed in the planar shape, the phototransistor manufacturing process can be simplified. When thin film phototransistors of the present invention, mentioned above, are used as picture elements of a photosensor array, an extremely satisfactory result can be obtained. The disadvantages of a photosensor array by the conventional technology, mentioned previously, can be eliminated by employing a photosensor array comprising thin film phototransistors of the present invention in the picture elements. Descriptions of a photosensor array of the present invention follow.

A one-dimensional contact photosensor of the present invention is structured such that (1) thin film field effect phototransistors comprising semiconductor such as amorphous silicon are formed as independent islands on a substrate, (2) the source electrodes of the phototransistors are connected together in common, and (3) the gate electrodes and drain electrodes are connected for each group. Each phototransistor is provided with a window region in it or in the adjacent region to introduce light.

To suppress an increase in crosstalk due to an increase in the number of picture elements, a thin film transistor may be added to each picture element comprising a phototransistor. This thin film transistor allows the switching function of each picture element to be made more perfect.

In a one-dimensional photosensor of the configuration mentioned above, the phototransistors are scanned one by one when the potential of the source electrodes, which are connected together in common, is set to the reference potential (ground potential) and pulse voltages are applied to the gate electrodes sequentially and to the drain electrodes also sequentially, which are connected for each group (namely, the gate electrodes are grouped into m groups and the drain electrodes n groups). When voltages are applied concurrently to the gate and drain electrodes, the normal phototransistor operation is provided by the phototransistor switching characteristics. This permits the sequential scanning mentioned above.

In each phototransistor which enters the operable state by the sequential scanning, a large drain current flows when an optical signal is input because photocarriers are generated in the channel region. When no optical signal is input, the transistor channel is not completed and no drain current flows because no photocarriers are generated. Therefore, an optical signal can be detected for each picture element. By providing a window portion in each phototransistor or in the adjacent region, a lensless contact sensor can be realized.

The pitch between the picture elements containing phototransistors can be determined in consideration of the design requirements and the pattern accuracy with the production technique.

When the window region is provided, the light from the light source reaches a manuscript through the window of the light shield and the gap between the gate and drain wires, is reflected off of the manuscript, and absorbed into the semiconductor layer. The region through which the light passes and the semiconductor region should be designed optimally. It is desirable that the ratio of the two region areas is not so large. A ratio of close to 1 is effectual. The ratio depends on the light intensity, the reflection factor of the manuscript, and the photosensitivity. The desired ratio ranges from ½ to 2.

By arranging thin film phototransistors of the present invention two-dimensionally on a substrate, a two-dimensional photosensor array, which allows image input by all-electron scanning, can be produced. This two-dimensional photosensor array can become an array with a large area, high sensitivity, and rapid-response. Descriptions of a two-dimensional photosensor array follow.

In the same way as with a one-dimensional photosensor, by providing a window portion, through which light is introduced, in each phototransistor or in the adjacent region, a two-dimensional lensless contact sensor array can be produced. This contact sensor system allows an image input unit to be thinned.

To suppress an increase in crosstalk due to an increase in the number of picture elements, a thin film transistor may be added to each picture element in addition to each phototransistor. To produce a sensor array which has a large area, high sensitivity, and a rapid response function, amorphous silicon can be used for the photosensitive region of each phototransistor and for each thin film transistor. By doing this, satisfactory results can be obtained. However, another semiconductors may be used for that purpose.

The pitch between the picture elements containing phototransistors can be determined in consideration of the design requirements and the pattern accuracy with the production technique.

Each phototransistor formed on a substrate is a thin film field effect transistor of the present invention mentioned above. Incident light can be converted to an electric signal by applying a bias voltage to the source, drain, and gate electrodes. Each phototransistor has a photoelectric conversion function as well as a switching function and an amplifying function, so that many picture elements two-dimensionally arranged on the substrate can be scanned one by one to fetch a signal externally without crosstalk. The amplifying function provides a high SN ratio.

A thin film transistor, which is added to the phototransistor of each picture element, allows the switching function of each picture element to be performed more perfectly.

A semiconductor layer such as amorphous silicon layer produces photocarriers when light is irradiated to it, which play a roll in connecting the channels in the gate gaps. If this occurs, each phototransistor starts operation. This transistor possibly has a location, where light is irradiated, or another terminal in addition to the gate, source, and drain terminals. Therefore, this transistor is practically a four-terminal device, which can be widely used.

BRIEF DESCRIPTION OF THE DRAWINGS

FIGS. 28b and 28c show the A—A' and B—B' section views, respectively, of the one-dimensional photosensor shown in FIG. 28a;

FIGS. 36 and 37 show the plan and section views of the two-dimensional photosensor shown in FIG. 35a.

DESCRIPTION OF THE PREFERRED EMBODIMENTS

Embodiment 1

Figure 1:
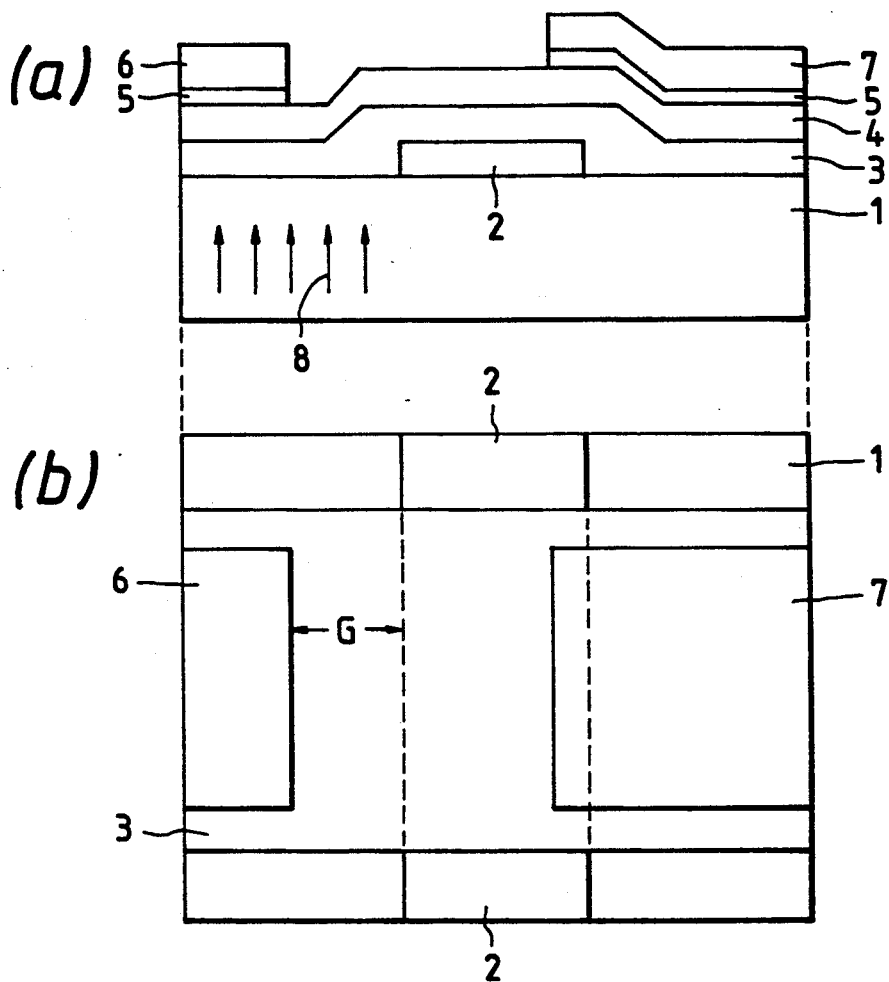
FIGS. 1a and 1b shows the section and plan views, respectively, of a thin film phototransistor with one gate electrode of the embodiment of the present invention.

FIG. 1 shows the section view (a) and plan view (b) of a phototransistor of the present embodiment. The manufacturing process is as follows: Metallic chromium is deposited 150 nm in thickness on glass substrate 1 by the sputtering method. This layer is patterned by the photolithography method to form gate electrode 2. Silicon nitride as a gate insulating film 3 and hydrogenated amorphous silicon (a-Si:H) as a semiconductor layer 4 are deposited on it by the plasma CVD method 300 nm in thickness and 500 nm in thickness, respectively. In addition to these two layers, a-Si:H n+ layer 5 of 40 nm in thickness is deposited by the plasma CVD method to form an ohmic contact layer.

The plasma CVD method is used to introduce gases containing monosilane $SiH_4$ as a base gas into a vacuum vessel, to form plasma by applying RF power, and to deposit Si and hydrogen, decomposed from the gases, on a substrate. In this case, a-Si:H is formed. By introducing $SiH_4$ as well as nitrogen ($N_2$) and/or ammonia ($NH_3$), SiN is formed. By introducing phosphine ($PH_3$), a-Si:H in which an N type impurity of phosphorus is doped is formed. These substances are used to form a gate insulating film and an ohmic contact layer. After the layers are deposited, the a-Si:H layer is patterned.

The source and drain electrodes can be formed at the next step. Two-layer films of Cr and Al are used as an electrode material. The Cr layer is a buffer layer to prevent a reaction of a-Si and Al, and the Al layer functions to reduce the resistance of each electrode. The layers are 100 nm and 300 nm in thickness, respectively. The source and drain electrodes are formed by patterning the layers. The a-Si n+ layer is etched by using the patterned source and drain electrodes as a mask. This is the self-alignment process. As shown in FIG. 1, the gap between gate electrode 1 and source electrode 6 is formed by patterning. The gap length (G) in this embodiment is 5 μm.

Figure 2:
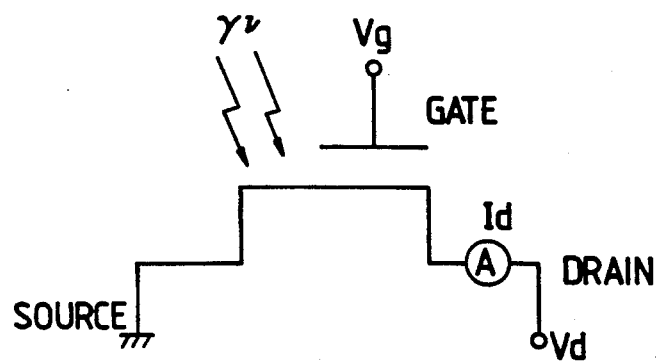
FIG. 2 shows a schematic circuit diagram indicating the status that a bias voltage is applied to a thin film phototransistor.
Figure 3:
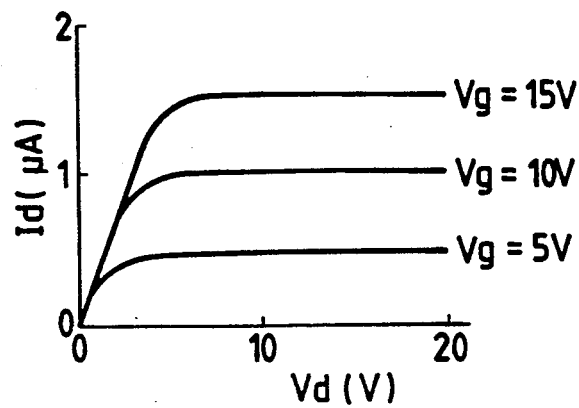
FIG. 3 shows a graph indicating the relationship between the drain current and the drain voltage of the phototransistor shown in FIG. 1 when the gate voltage is used as a parameter.
Figure 4:
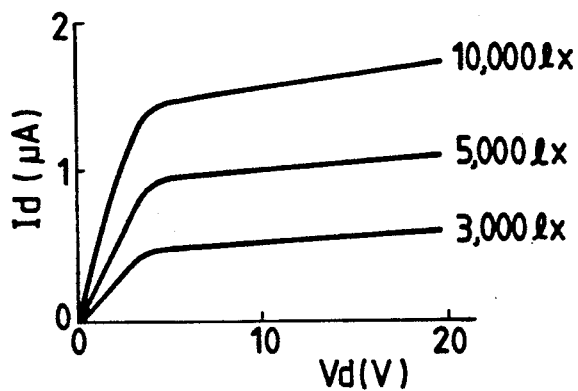
FIG. 4 shows a graph indicating the relationship between the drain current and the drain voltage of the phototransistor shown in FIG. 1 when the light intensity is used as a parameter.
Figure 5:
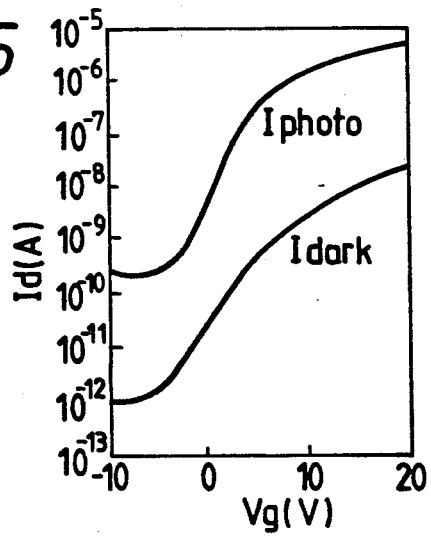
FIG. 5 shows a graph indicating the relationship between the drain current and the gate voltage of the phototransistor shown in FIG. 1.

The width (W) and length (L) of the transistor are 500 um and 15 μm, and, therefore, the distance between the gate end on the source side and the drain end is 10 μm. W indicates the width of the source and drain regions, and L indicates the distance between the source and drain regions. The overlapped region of the projections of drain electrode 7 and gate electrode 2 is 2 μm or more in length in the same way as with conventional transistor. It is often set to about 5 um. In this embodiment, it is set to 5 μm. The phototransistor produced as mentioned above is applied with a bias voltage as shown in FIG. 2, and light is irradiated from the gate electrode side to evaluate the characteristics of the phototransistor. FIG. 3 shows the relationship between the drain current (Id) and the drain voltage (Vd) when light of 5000 lux is irradiated. Good saturation characteristics can be obtained. FIG. 4 shows the dependence of the drain current on the light intensity when the gate voltage (Vg) is set to a constant value of 10 V. FIG. 5 shows the relationship between the drain current (Id) and the gate voltage (Vg) when light of 5000 lux is irradiated. The ratio of the drain current ($I_{dark}$) when no light is irradiated to that ($I_{photo}$) when light is irradiated (namely, $I_{photo}/I_{dark}$) is 300. This is a satisfactory value. The current ratio of a conventional phototransistor is about 100 at most.

Embodiment 2

Figure 6:
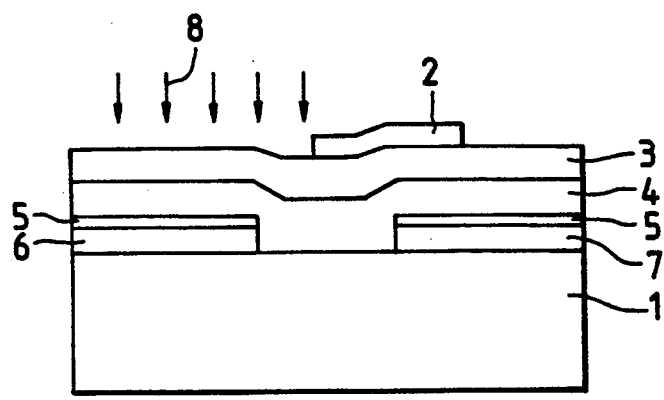
FIGS. 6 to 9 show the section views of thin film phototransistors with one gate electrode of the embodiments of the present invention.

FIG. 6 shows another embodiment of the present invention. Cr is deposited on a substrate by the sputtering method, and n+ a-Si:H film 5 is deposited as an ohmic contact layer by the plasma CVD method. The film is patterned to form source electrode 6 and drain electrode 7. The a-Si:H layer 4 and silicon nitride film 3 are deposited on them by the plasma CVD method. Gate electrode 2 is formed by the process to form it on a gate insulating film and by the patterning process. A gap is provided between the source and gate electrodes in the same way as Embodiment 1, and light 8 is irradiated to it.

The characteristics of the phototransistor in this embodiment are satisfactory in the same way as with Embodiment 1.

Embodiment 3

Figure 7:
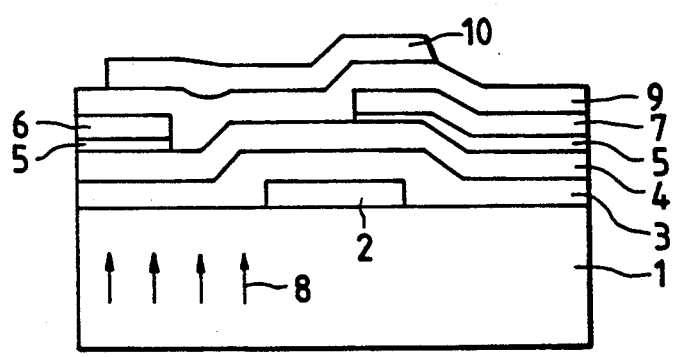

FIG. 7 shows another embodiment of the present invention. The phototransistor in this embodiment is basically similar to the one in FIG. 1, except that light shield 10 is added to block off light from the top. The light shield is made of metallic chromium, so that $SiO_2$ film 9 is inserted between the source and drain electrodes to prevent a short-circuit.

In a phototransistor of this structure, light is introduced from the bottom like light 8 in the figure, and stray light from the top is blocked off by light shield 10.

Embodiment 4

Figure 8:
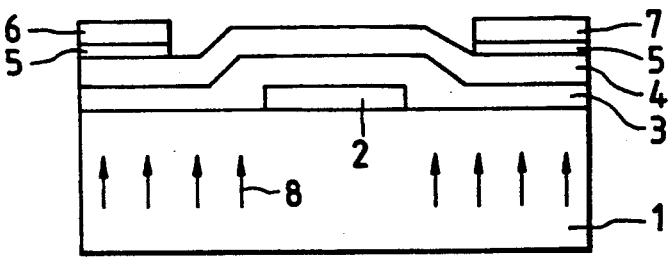

FIG. 8 shows another embodiment of the present invention. In this embodiment, a gap is provided between the drain and gate electrodes in addition to the gap between the source and gate electrodes. This structure reduces the drain current when no light is irradiated and is effective in improving the phototransistor characteristics.

The values for G, W, and L in Embodiments 2 to 4 are the same as those in Embodiment 1. The thickness of each layer in Embodiments 2 to 4 is the same as that of the corresponding layer in Embodiment 1.

In each embodiment mentioned above, the material of the semiconductor layer is a-Si:H. However, a-SiC, a-SiGe, a-Ge, a-C, or group III-V or II-VI compound semiconductors may be used to produce the effect expected by the present invention. As a gate insulating film, oxide such as silicon dioxide, $Ta_2O_5$, or $Al_2O_3$, or their laminated layer such as $SiN$-$SiO_2$, $Ta_2O_5$-$SiN$, or $Al_2O_3$-$SiN$ may be used to produce the same effect as that of silicon nitride.

Embodiment 5

Figure 9:
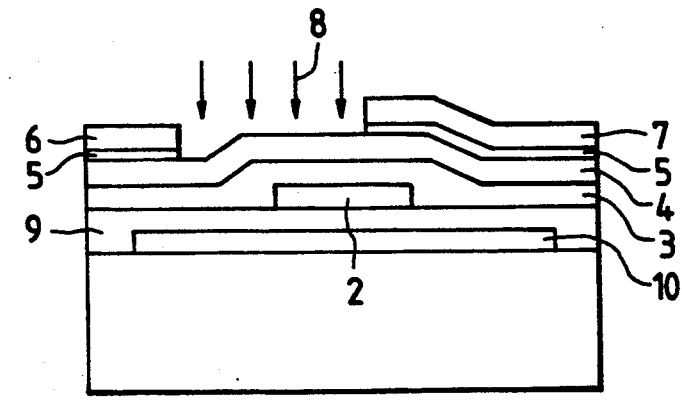

The light shield is described in Embodiment 3. However, it may be used in the other embodiments to provide better characteristics. FIG. 9 shows such an example. Light is introduced from the top in this example, and better characteristics can be obtained.

In each embodiment mentioned above, there is no overlapped region (the overlap of the projection of each electrode, and so hereinafter) between the gate and source electrodes. However, a phototransistor having a gap between the gate and drain electrodes (no overlapped region is provided) or a phototransistor having no overlapped region on both source and drain sides is also available as shown in FIG. 8.

In the embodiments, the surface of each phototransistor is not covered with a protective film. In practical production, however, it is recommended the surface be covered with an inorganic film of silicon nitride or similar material, or with an organic film of polyimide isoindro-quinazolmedione (PIQ) or similar material (transparent or opaque). Insulating film 9 in FIG. 7 may be an organic film as mentioned above.

In the embodiments mentioned above, phototransistors of the stagger type are used. However, phototransistors of the coplanar type can be also used to produce the effect expected by the present invention.

Each same reference numeral in FIGS. 1 to 9 indicates the same item.

Each thin film phototransistor with one gate electrode of the present invention can be provided with both a photosensing function and a switching function by installing the gate, source, and drain electrodes so that no overlapped region is provided between the gate and source electrodes and/or between the gate and drain electrodes. Such a phototransistor has a high input impedance and a voltage control function because it is a field effect transistor.

The following are embodiments of thin film phototransistors with a plurality of gate electrodes.

Embodiment 6

Figure 10:
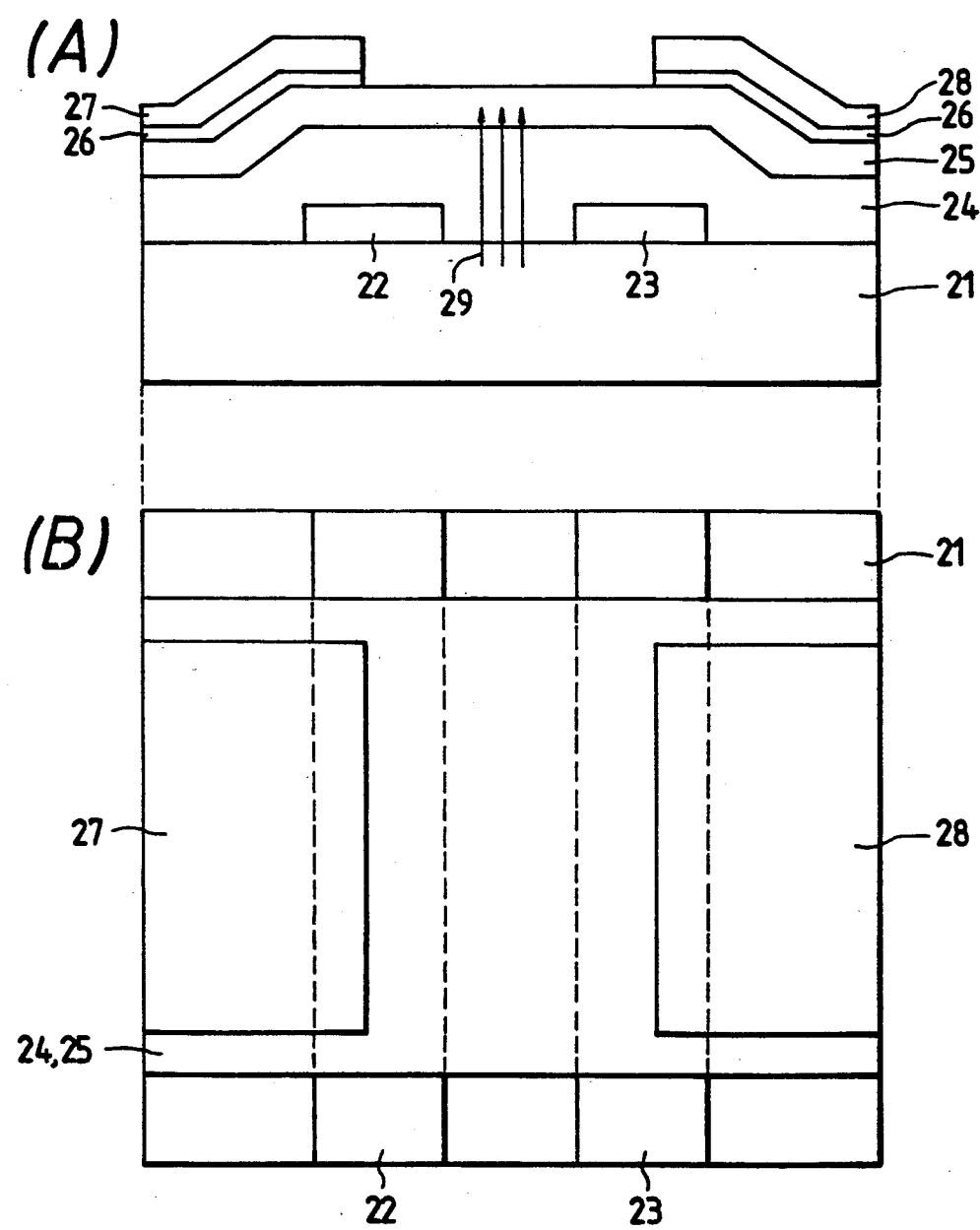
FIGS. 10A and 10B show the section and plan views, respectively, of a thin film phototransistor with a plurality of gate electrodes of the embodiment of the present invention.

FIG. 10 shows the section view (A) and plan view (B) of a thin film phototransistor which is an embodiment of the present invention. In the figure, numeral 21 designates a glass substrate, 22 and 23 gate electrodes, 24 a gate insulating film, 25 a photosensitive semiconductor layer, 26 an ohmic contact layer, 27 a source electrode, and 28 a drain electrode. Arrow mark 29 indicates incident light.

This embodiment is a bottom gate type thin film transistor of the reverse stagger structure as shown in the section view (A). The gate electrode is divided into two parts 22 and 23. Light 29 introduced through the gap between them generates photocarriers in photosensitive semiconductor layer 25.

In the plan view (B) of FIG. 10, gate electrodes 22 and 23 are shown as two independent electrodes, though they are connected together outside the figure. The electrode pattern is such that one gate electrode is branched to two in the figure. As described later, there is a phototransistor in which electrodes 22 and 23 are independent.

The manufacturing process is as follows: Metallic chromium is deposited 200 nm in thickness on glass substrate 21 by the sputtering method. The layer is patterned by the photolithography method to form gate electrodes 22 and 23.

Silicon nitride and hydrogenated amorphous silicon (a-Si:H) are deposited on it by the plasma CVD method to form gate insulating film 64 of 350 nm in thickness and photosensitive semiconductor layer 25 of 550 nm in thickness, respectively. In addition to the two layers, an a-Si:H n layer of 50 nm in thickness is deposited by the plasma CVD method to form ohmic contact layer 26.

Source electrode 27 and drain electrode 28 can be formed at the next step. Two-layer films of Cr and Al are used as an electrode material. The Cr layer is a buffer layer to prevent a reaction of a-Si:H and Al, and the Al layer functions to reduce the resistance of each electrode. The layers are 100 nm and 300 nm in thickness, respectively. The source and drain electrodes are formed by patterning the layers. The a-Si:H n layer is etched by using the patterned source and drain electrodes as a mask. This is the self-alignment process. A protective film, which is not shown in the figure, is formed on the device produced as mentioned above.

In FIG. 10, the gap length (G) between gate electrodes 22 and 23 is 10 μm. The values of W and L of the transistor are 500 μm and 20 μm. The distance between source electrode 67 and drain electrode 28 is 20 μm, that between the source electrode end and the end of gate electrode 22 is 5 μm, and that between the end of gate electrode 23 and the drain electrode end is 5 μm.

Figure 11:
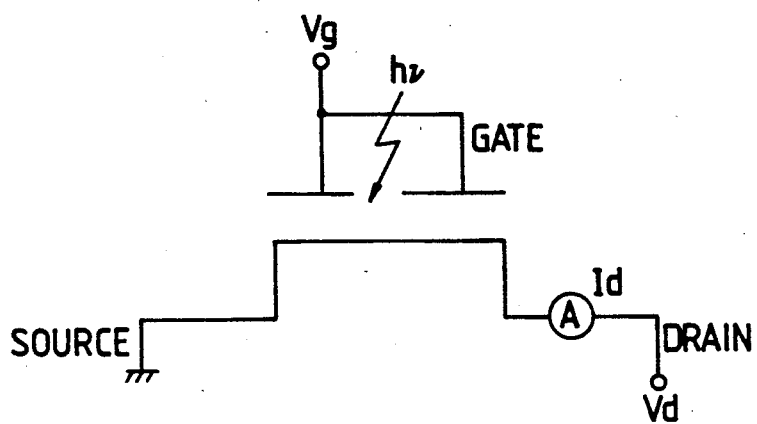
FIG. 11 shows a schematic circuit diagram indicating the status that a bias voltage is applied to a thin film phototransistor with a plurality of gate electrodes.

The phototransistor produced as mentioned above is applied with a bias voltage as shown in the circuit diagram in FIG. 11, and light hν is irradiated from the gate electrode side to measure the relationship between the drain current (Id) and the drain voltage (Vd). Vg indicates the gate voltage.

Figure 12:
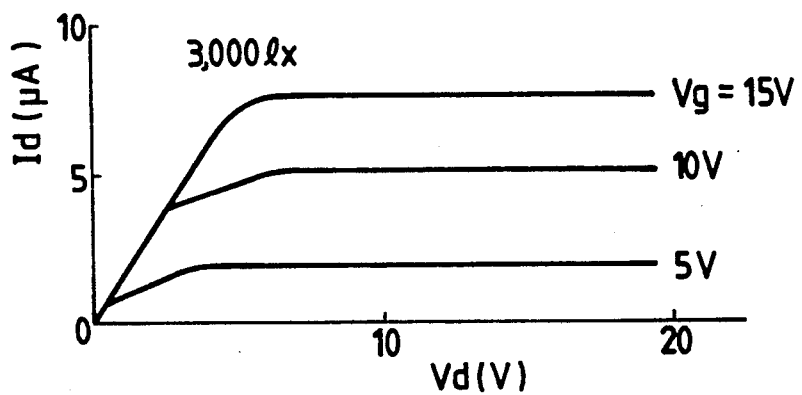
FIG. 12 shows a graph indicating the relationship between the drain current and the drain voltage of the phototransistor shown in FIG. 10 when the gate voltage is used as a parameter.

FIG. 12 shows the relationship between the drain current and the drain voltage when light of 3000 lux is irradiated. The saturation characteristics are satisfactory as shown in the figure.

Figure 13:
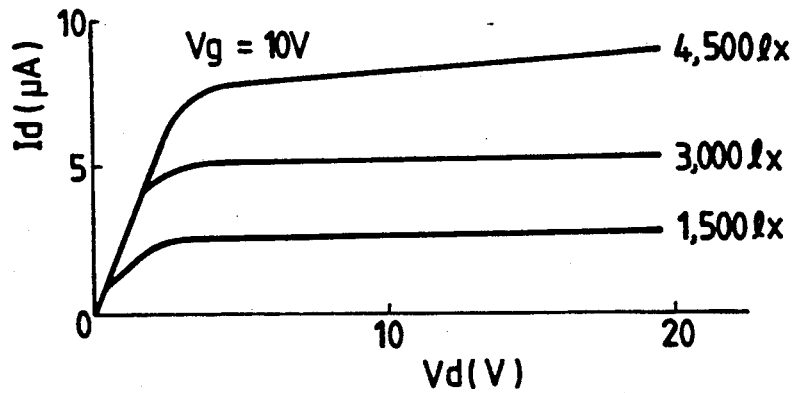
FIG. 13 shows a graph indicating the relationship between the drain current and the drain voltage of the phototransistor shown in FIG. 10 when the light intensity is used as a parameter.

FIG. 13 shows the dependence of the drain current on the light intensity when gate voltage Vg is set to a constant value (Vg=10 V). As shown in the figure, the ratio of the photocurrent of the device to the dark current is increased up to 1000. In this embodiment, one gate electrode is branched to two electrodes (namely, two gate electrodes are connected together). Multiple gate electrodes are connected to one in a location other than the upper part of the channel, and a voltage is applied to one gate electrode which has a branch structure at the phototransistor portion. As briefly described previously, by dividing the gate electrode into multiple electrodes and applying a separate voltage to each one, the characteristics can be improved. Descriptions of one operation example of the phototransistor having gate electrodes 22 and 23 in FIG. 10, which are two independent electrodes, follow.

The drain current can be switched by controlling the voltage to be applied to gate electrode 23 on the drain side in FIG. 10 when +10 V is applied to drain electrode 28 and to gate electrode 22 on the source side respectively. When switching the drain current to ON, apply +10 V to gate electrode 23. This is the same bias condition as that when switching the drain current to ON in the embodiment of multiple branch electrodes previously mentioned. The drain current greatly varies with the presence or absence of incident light. When switching the drain current to OFF, apply −10 V to gate electrode 23. If this occurs, a hole channel is formed by gate electrode 23 and an electronic channel is formed by gate electrode 22. In this state, gate electrode 23 serves as a blocking gate for electrons and gate electrode 22 serves as a blocking electrode for positive holes, and the OFF current can be improved resultantly. In addition, the switching speed can be improved.

Embodiment 7

Figure 14:
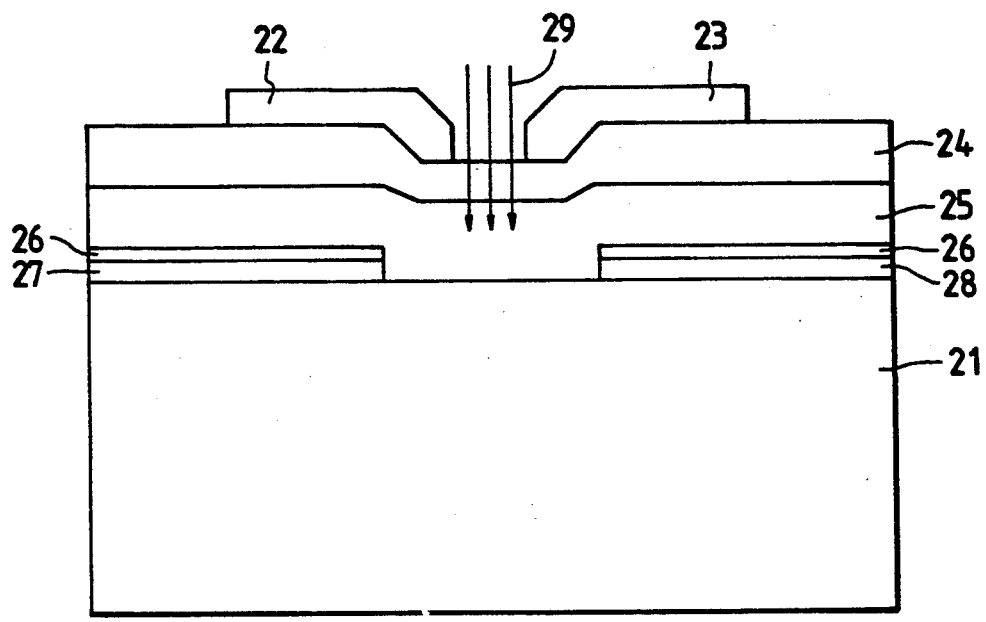
FIGS. 14 to 17 show the section views of thin film phototransistors with a plurality of gate electrodes of the embodiments of the present invention.

FIG. 14 shows the section view of the second embodiment of a thin film phototransistor with more than one gate electrode of the present invention.

In this embodiment, gate electrodes 22 and 23 are installed on the top of the device.

The manufacturing process is as follows: Cr is deposited on glass substrate 21 by the sputtering method. Then, n type a-Si:H is deposited by the plasma CVD method. Source electrode 27 and drain electrode 28 can be formed by patterning it. a-Si:H and silicon oxide are deposited on them by the plasma CVD method to form photosensitive semiconductor layer 25 and gate insulating film 24. Metallic film chromium for gate electrodes is deposited by the sputtering method, then patterned to form gate electrodes 22 and 23. The value for G is the same as that in the embodiment 6.

This device is operated, in the same way as with the embodiment in FIG. 10, by introducing light through the gap between gate electrodes 22 and 23 and applying a bias voltage to the gate, source, and drain electrodes. As a result, the characteristics of the phototransistor are satisfactory the same as with the embodiment in FIG. 10.

Embodiment 8

Figure 15:
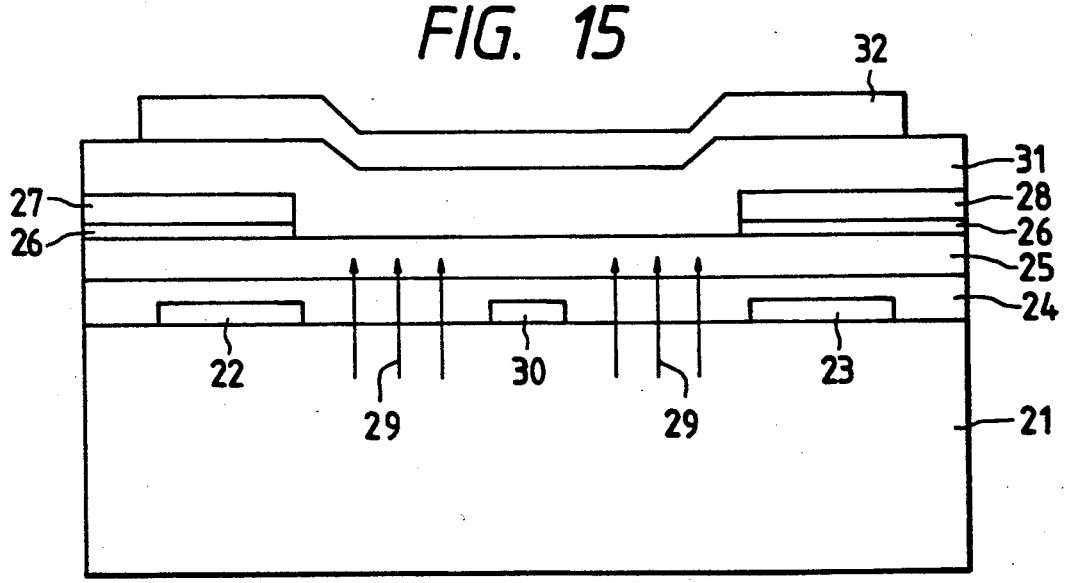

FIG. 15 shows the section view of the third embodiment of a thin film phototransistor with more than one gate electrode of the present invention.

In this embodiment, a bottom gate phototransistor is used in the same way as in FIG. 10, and the gate electrode is divided into three electrodes 22, 23, and 30.

The structure of the gate electrodes is rather complicated, though the usable current range is wide.

Protective film 31 of silicon nitride is formed on photosensitive semiconductor 25 to minimize the effect of the air on the channel. Light shield 32 is formed to block off stray light from the top. In FIG. 10, a protective film and light shield in FIG. 15 may be installed.

Embodiment 9

Figure 16:
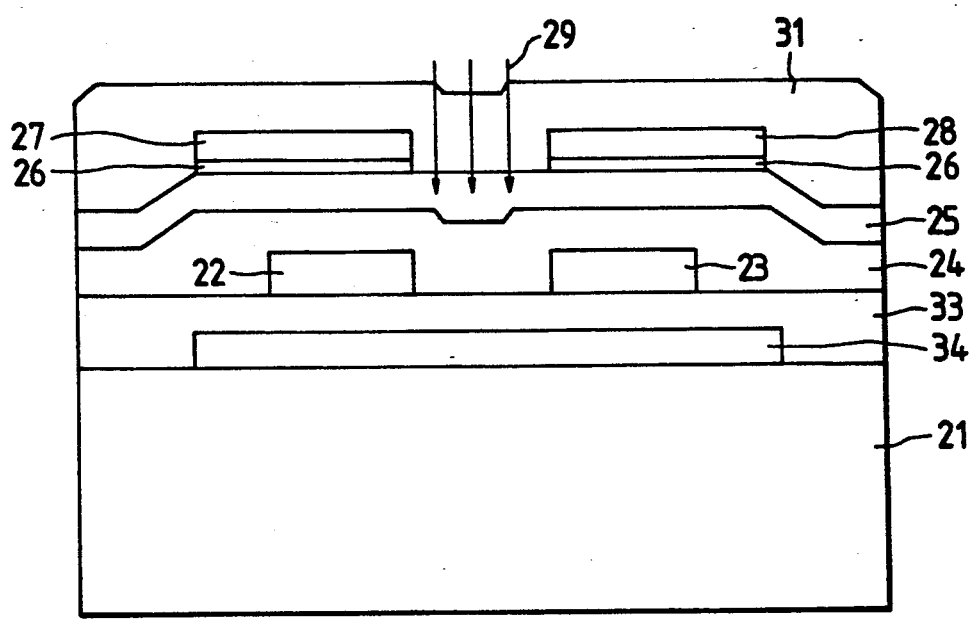

FIG. 16 shows the section view of the fourth embodiment of a thin film phototransistor with more than one gate electrode of the present invention.

In this embodiment, a bottom gate phototransistor is also used, though light from the bottom or the gate electrode side is blocked off by light shield 34. Therefore, incident light is introduced from the top or the source and drain electrode side. Reference numeral 33 indicates an insulating film. The gate electrode ends are aligned with the source and drain electrode ends.

Embodiment 10

Figure 17:
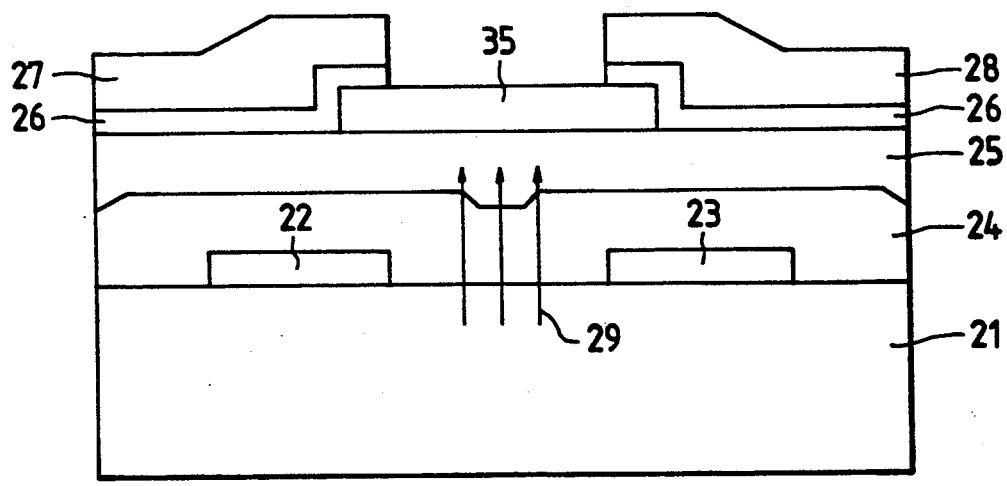

FIG. 17 shows the section view of the fifth embodiment of a thin film phototransistor with more than one gate electrode of the present invention.

In this embodiment, another type of bottom gate phototransistor is used.

The steps up to the one that photosensitive semiconductor layer (a-Si:H) 25, which serves as a channel, is deposited are the same as those in the embodiment in FIG. 10. In this embodiment, silicon nitride is deposited continuously to form protective film 35. The source and drain electrodes can be formed by patterning protective film 35 and thereafter by depositing and patterning ohmic contact layer 26 and Cr and Al films.

In this embodiment, the reproducibility of the a-Si:H film thickness of the channel can be improved compared with that in the embodiment in FIG. 10.

In Embodiments 6 to 10, phototransistors of the stagger type are used. However, phototransistors of the coplanar type can be used to produce the effect expected by the present invention.

Each same reference numeral in FIGS. 10 to 17 indicates the same item.

The values for W and L in Embodiments 7 to 10 are the same as those in Embodiment 6. The thickness of each layer in Embodiments 7 to 10 is the same as that of the corresponding layer in Embodiment 6.

In Embodiments 6 to 10, the material of each photosensitive semiconductor layer is a-Si:H. However, a-SiC:H, a-SiGe:H, a-Ge:H, a-C:H, or group III-V or II-VI compound semiconductors may be used instead of a-Si:H to produce the effect expected by the present invention.

As a gate insulating film, oxide such as silicon dioxide, $Ta_2O_5$, or $Al_2O_3$, or their laminated layer such as $SiN-SiO_2$, $Ta_2O_5-SiN$, or $Al_2O_3-SiN$ may be used to produce the same effect as that of silicon nitride. For a substrate, an opaque substrate (for example, a resin-coated metal substrate) may be used in the embodiment in FIG. 14 instead of a glass substrate.

Light shields are used in the embodiments in FIGS. 15 and 16, though they may be used in other embodiments to provide better characteristics.

A thin film phototransistor with more than one gate electrode of the present invention is a thin film field effect transistor with source, drain, and gate electrodes. Accordingly, it is a device which has a high input impedance and a voltage control function. This phototransistor has a structure that one gate electrode is branched to plural electrodes or that plural independent gate electrodes are provided, so that the photocurrent ON/OFF ratio can be increased to 1000 or a higher value. The γ characteristics are close to 1, which is a good value. When a plurality of independent gate electrodes are provided, the characteristics can be improved further by applying a separate voltage to each of them. By introducing light from the gate electrode side, the electrical control and the optical control of the drain current can be effectively separated from each other, and the photocarrier generation region is located close to the channel, providing good characteristics. The use of a photosensitive semiconductor layer of hydrogenated amorphous silicon provides a thin film phototransistor which has high photosensitivity (quantum efficiency: 1) and can be produced easily.

Embodiments of thin film phototransistors with transparent electrodes are as follows:

Embodiment 11

Figure 18:
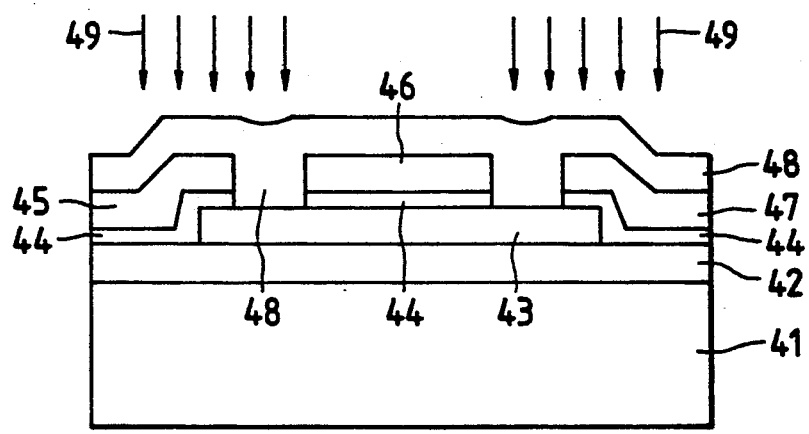
FIG. 18 shows the section view of a thin film phototransistor with transparent electrodes of the embodiment of the present invention.

Descriptions of the manufacturing process follow (see FIG. 18).

The a-Si:H (hydrogenated amorphous silicon) layer 42 of 500 nm in thickness, which is a semiconductor layer, and gate insulating film 43 of silicon nitride 300 nm in thickness are deposited on substrate 41 by the plasma CVD method. Silicon nitride film 43 is patterned by the photolithography method. The n+a-Si:H layer 44 of 30 nm in thickness, which is an ohmic contact layer, and a Cr film of 200 nm in thickness for a gate electrode are deposited on it by the plasma CVD method and the sputtering method respectively.

The Cr film is patterned to form gate electrode 46. Then indium-tin oxide (ITO) is deposited by the sputtering method, and patterned to form source electrode 45 and drain electrode 47. The n+layer 44 is removed using electrodes 45, 46, and 47 as a mask to produce a phototransistor. Silicon nitride is deposited last as a protective film, and a contact hole is formed to finish the entire process.

When only $SiH_4$ is used by the plasma CVD method, an a-Si:H layer (intrinsic (i) layer) without doping is formed. By introducing $SiH_4$ as well as nitrogen and/or ammonia, SiN is formed. By introducing phosphine ($PH_3$), a-Si:H in which an N type impurity of phosphorus is doped is formed. These substances are used to form a gate insulating film, a protective film, or an ohmic contact layer. To form an i layer or n+ layer of a-Si:H, it is effectual to introduce SiH4 and hydrogen into a vessel.

In this embodiment, as shown in FIG. 18, the patterning step is performed so that gaps are provided between source electrode 45 and gate electrode 46 and between drain electrode 47 and gate electrode 46. The gap length is 5 µm. The values of W and L of the transistor are 500 µm and 20 µm, so that the gate width is 10 µm.

Figure 19:
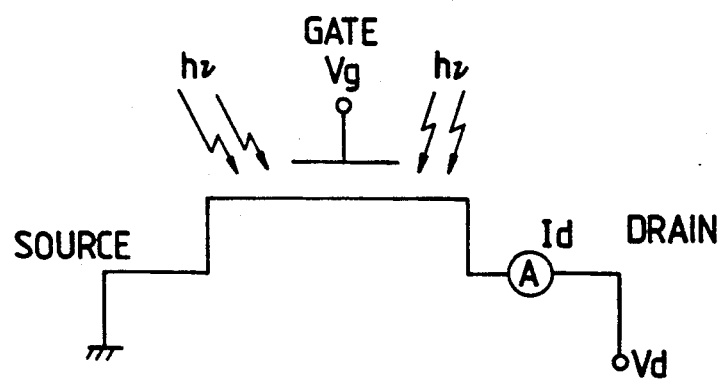
FIG. 19 shows a schematic circuit diagram indicating the status that a bias voltage is applied to a thin film phototransistor with transparent electrodes.

The phototransistor produced as mentioned above is applied with a bias voltage as shown in FIG. 19, and light $h_\nu$ 49 is irradiated from the gate electrode 46 side to evaluate the characteristics.

Figure 20:
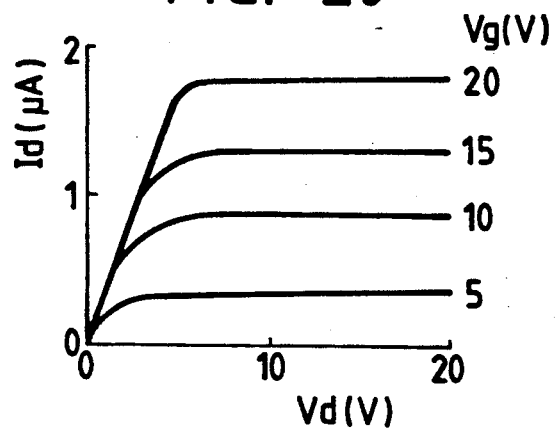
FIG. 20 shows a graph indicating the relationship between the drain current and the drain voltage of the phototransistor shown in FIG. 18 when the gate voltage is used as a parameter.

FIG. 20 shows the relationship between the drain voltage (Vd) and the drain current (Id) when light of 5000 lux is irradiated. When the gate electrode potential (Vg) is set to the source electrode potential or to a negative potential, the drain current (Id) is kept at a low level. When the gate potential (Vg) is applied with a positive bias voltage, the drain current (Id) with the good saturation characteristics shown in the figure flows.

Figure 21:
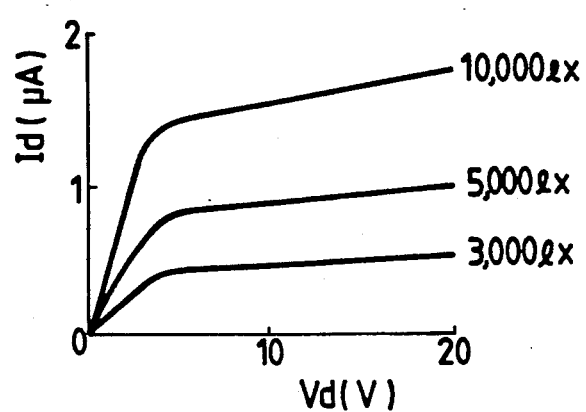
FIG. 21 shows a graph indicating the relationship between the drain current and the drain voltage of the phototransistor shown in FIG. 18 when the light intensity is used as a parameter.
Figure 22:
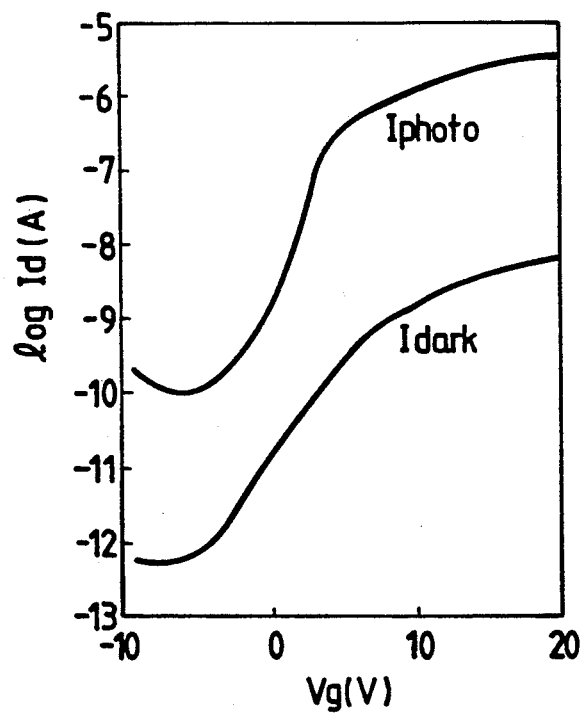
FIG. 22 shows a graph indicating the relationship between the drain current and the gate voltage of the phototransistor shown in FIG. 18.

FIG. 21 shows the dependence of the drain current (Id) on the light intensity when the gate voltage (Vg) is set to a constant value of 10 V. FIG. 22 shows the relationship between the drain current (Id) and the gate voltage (Vg) when light of 5000 lux is irradiated. The ratio ($I_{photo}/I_{dark}$) of the drain current when light is irradiated to that when no light is irradiated is 600. This is a satisfactory value.

Embodiment 12

Figure 23:
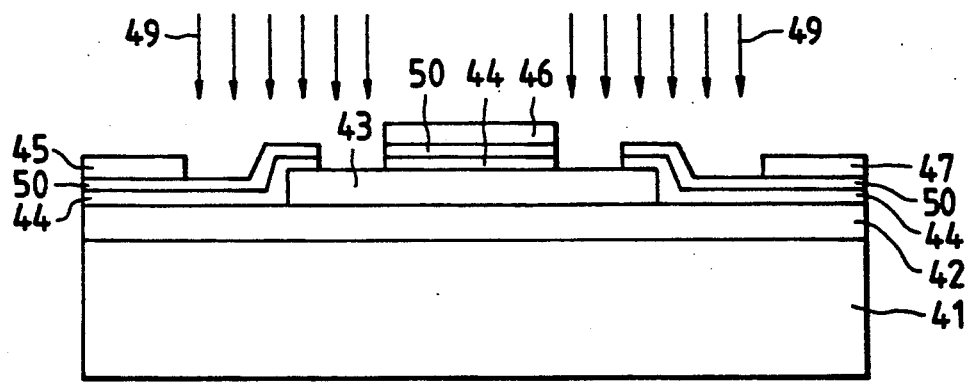
FIGS. 23 to 25 show the section views of thin film phototransistors with transparent electrodes of the embodiments of the present invention.

FIG. 23 shows another embodiment of a phototransistor with transparent electrodes of the present invention. This embodiment is similar to that in FIG. 18 except the transparent electrodes and the manufacturing process. The gate insulating film of silicon nitride 43 is patterned. Then, a-Si:H n+ layer 44 is deposited by the plasma CVD method, and Cr is deposited by the sputtering method. Substrate 41 should be preheated at 200° C. By doing this, interface reaction layer 50 is formed between the n+ a-Si:H 4 and Cr layers. This interface reaction layer 50 is a layer which should be called amorphous silicide and is characterized by an extremely thin film (about 2 nm). As detailed in Japanese Patent Laid-Open 1984-110179 mentioned previously, this interface layer 50 is high in conductivity though it is thin and transmits light well because it is thin. Therefore, the layer is useful as a transparent conductive film.

A metal containing at least one of the metal group of Mo, W, Ti, Ta, V, Zr, Hf, Ni, and Cu may be used as a material of the interface layer 50 to obtain the same effect as that of Cr. When depositing such a metal, each substrate may be heated, or after deposited at room temperature, the metal may be heated at about 200° C. The heat treating atmosphere is not significant. Vacuum, nitrogen, and air provide an almost same result.

After interface layer 50 is formed, source electrode 45, gate electrode 46, and drain electrode 47 are separately formed. In this case, the Cr film interface reaction layer and the n+ a-Si:H layer are etched off to separate them. Cr is removed with source electrode 45 and drain electrode 47 partially left. By doing this, the region of interface reaction layer 50 on the gate electrode side is exposed. This layer serves as a transparent electrode. In this structure, incident light 49 not only enters the gaps between the source and gate electrodes and between drain electrode 47 and gate electrode 46 to generate photocarriers but also reaches the semiconductor layer through the exposed interface layer to generate photocarriers. By doing this, carriers are supplied sufficiently and a phototransistor with good characteristics can be produced.

This embodiment is featured by that a material which is sensitive to the process, such as ITO, is not used and a phototransistor can be produced by a simple process.

Embodiment 13

Figure 24:
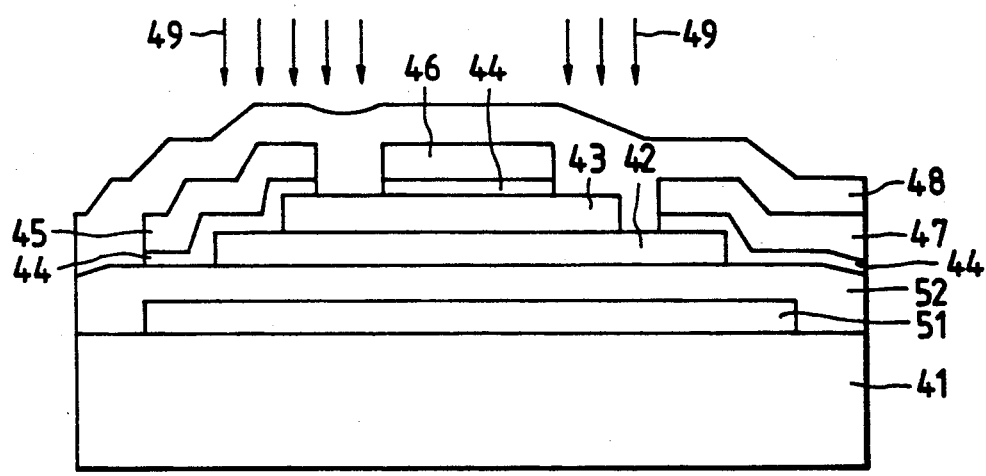

FIG. 24 shows another embodiment of a phototransistor with transparent electrodes of the present invention.

Light shield 51 of Cr is formed on glass substrate 41, and silicon nitride 52 for an insulating film is deposited. The a-Si i layer 42 and gate insulating film 43 of silicon nitride are formed and patterned on it. The a-Si n+layer 44 and Cr are deposited, then the Cr layer is patterned to form gate electrode 46 and drain electrode 47. ITO is deposited by the sputtering method to form transparent source electrode 45. The n+a-Si layer 44 is etched and removed using source electrode 45, gate electrode 46, and drain electrode 47 as a mask, and protective film 48 is deposited last.

Embodiment 14

Figure 25:
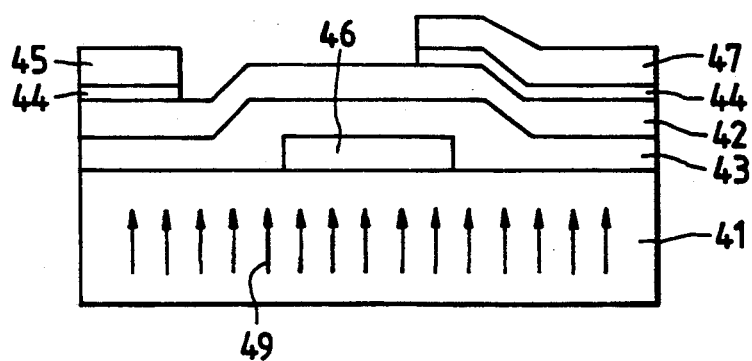

As a result of the processing mentioned above, the effect of light from the substrate side can be minimized, and the dark current level can be made extremely low. FIG. 25 shows another embodiment of a phototransistor with transparent electrodes of the present invention. The phototransistor is a transistor of the stagger type, in which a semiconductor layer intervenes between the gate and source electrodes and between the gate and drain electrodes respectively. Gate electrode 46 is made of ITO, and source electrode 45 and drain electrode 47 are made of Cr. Light is irradiated to almost the overall semiconductor layers and a phototransistor with good photosensitive characteristics can be obtained.

In Embodiments 11 to 13, a gap is provided both between the source and gate electrodes and between the drain and gate electrodes. A phototransistor with an overlapped region in either is available.

For example, it is possible that the gate and drain electrodes have an overlapped region and a gap is provided between the source and gate electrodes. In this case, an insulating film of silicon nitride should intervene between the gate and drain electrodes.

Transparent electrodes can be used for a thin film phototransistor with more than one gate electrode.

The use of at least one transparent electrode of the gate, source, and drain electrodes of a thin film phototransistor with transparent electrode of the present invention increases the light utilization factor and provides a highly photosensitive phototransistor.

The use of transparent electrodes makes the manufacturing process for phototransistors of the planar type comparatively easy. The use of a-Si:H for semiconductor layers increases the photosensitivity, the $I_{on}/I_{off}$ ratio, and the $I_{photo}/I_{dark}$ ratio of a phototransistor.

The use of an interface reaction layer as a transparent electrode makes the phototransistor manufacturing process easy.

Each same reference numeral in FIGS. 18 to 25 indicates the same item.

Descriptions of the embodiments of one-dimensional contact photosensors of the present invention follow.

Embodiment 15

Figure 26A:
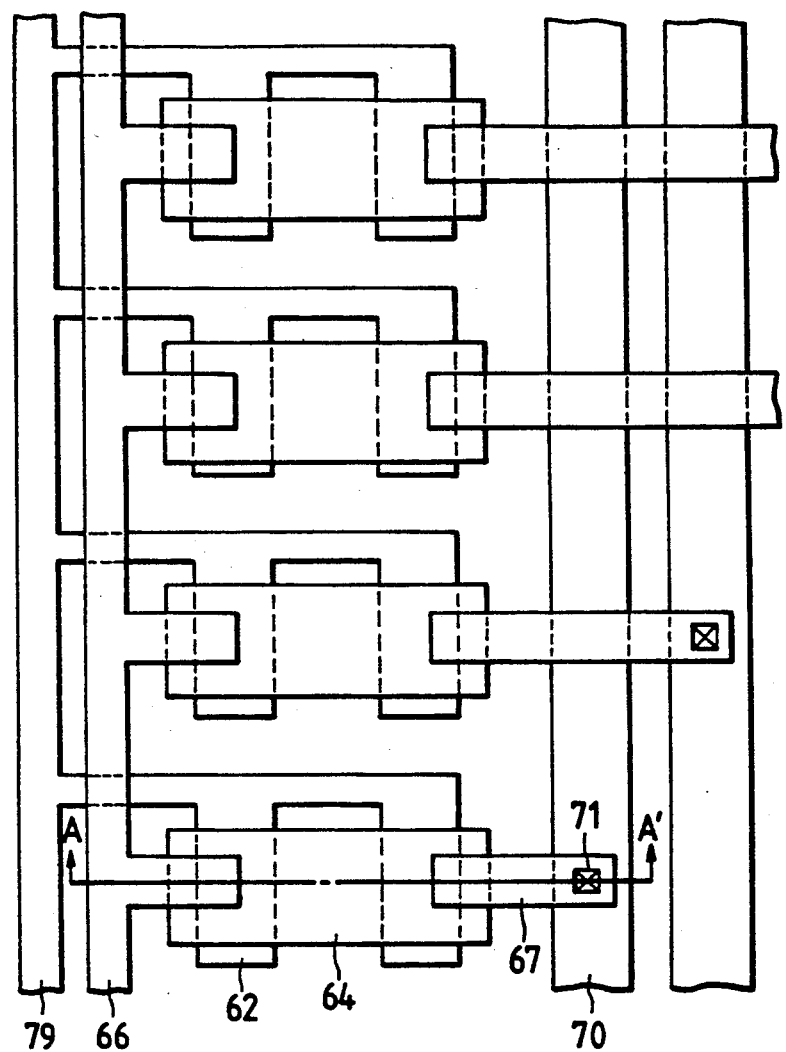
FIGS. 26a and 26b show the plan view and A—A' section view, respectively, of the picture element region of a one-dimensional contact photosensor of the embodiment of the present invention.
Figure 26B:
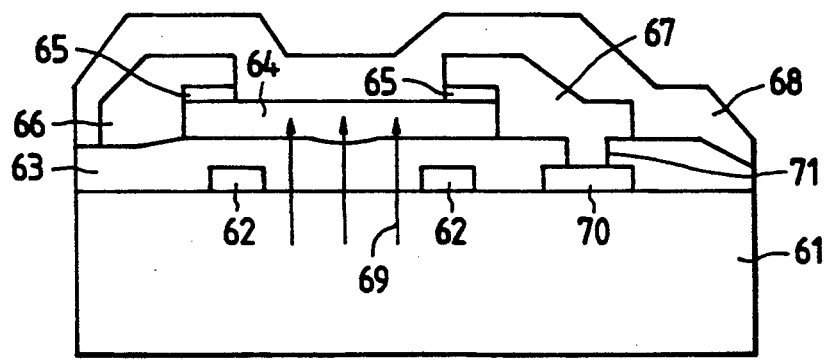
Figure 26C:
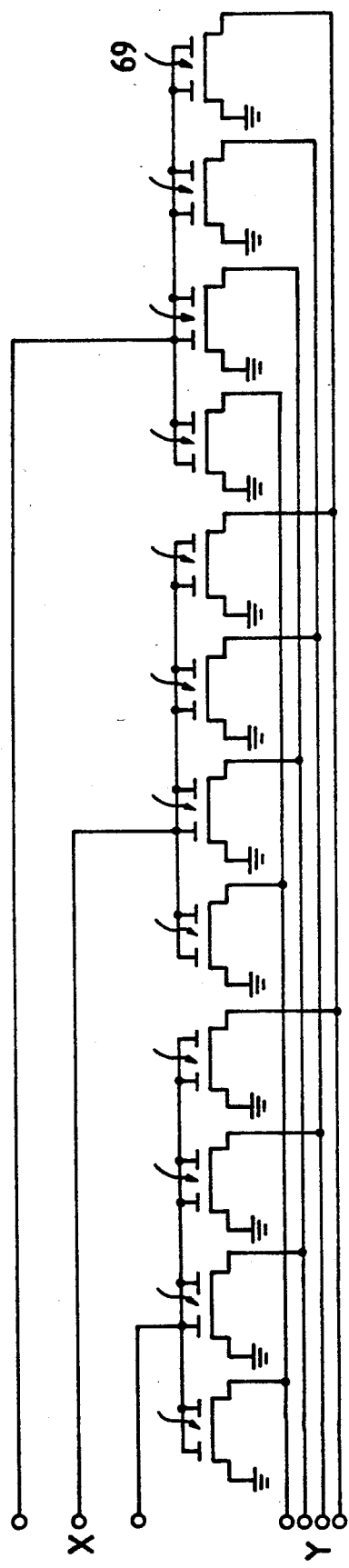
FIG. 26c shows a circuit diagram indicating the gate and drain bus lines of the one-dimensional photosensor mentioned above.

FIGS. 26a to 26c show the configuration diagrams of one embodiment of a one-dimensional contact photosensor of the present invention; that is, FIG. 26a shows the plan view of the picture element region, FIG. 26b shows the section view of the picture element region, and FIG. 26c shows a conceptual diagram of the connection status of the picture elements and the gate and drain bus lines (X and Y) using a 3 by 4 matrix.

Descriptions of the sensor manufacturing process follow. Metallic chromium (Cr) is deposited 150 nm in thickness on glass substrate 61 by the sputtering method, and the film is patterned so that gate electrode 62 is branched to two electrodes on the transistor region. Simultaneously, gate bus line 79 is grouped and drain bus line 70 is patterned. Silicon nitride and hydrogenated amorphous silicon (a-Si:H) are deposited by the plasma CVD method to form gate insulating film 63 of 300 nm in thickness and semiconductor layer 64 of 450 nm in thickness. Then, n a-Si layer 65 is deposited to form an ohmic contact layer in the same way. When only $SiH_4$ is used by the plasma CVD method, an a-Si:H layer without doping is formed. By introducing phosphine (PH3) gas, a-Si in which an N type impurity of phosphorus is doped is formed. By introducing $SiH_4$ as well as nitrogen ($N_2$) and ammonia ($NH_3$), silicon nitride (SiN) is formed. This film is used as a gate insulating film or a protective film.

Source electrode 66 and drain electrode 67 are formed by sputter-depositing and patterning a Cr film of 150 nm in thickness. In this case, source electrode 66 is formed in a shape such that it is connected to the common bus line, and drain electrode 67 is connected to drain bus line 70, which is formed simultaneously with the gate electrode, via contact hole 71. For that purpose, contact hole 71 is formed in silicon nitride 63 on bus line 70 before the source and drain electrode material is deposited. By doing this, the drain electrodes are grouped. The n a-Si layer of patterned source electrode 66 and drain electrode 67 is etched. This is a self-matching process.

Each phototransistor formed as mentioned above is connected to each bus line as shown in FIG. 26c. For that purpose, each source electrode is connected to the common bus line first. Each gate electrode and drain electrode are connected to each of m and n bus lines. Therefore, the gate bus line consists of m bus lines, as shown in the figure, to which the gates of the n phototransistors are commonly connected (m=3 and n=4 in the case of FIG. 26c). The drain bus line consists of n bus lines to which the drains arranged every m phototransistors are connected. The total number of picture elements or the total number of phototransistors is m by n. Reference numeral 69 indicates the incident light.

The pitch between the picture elements is 8 picture elements/mm. The pitch may be set to 16 picture elements/mm. When the pitch is 8 picture elements/mm, the values for G, W, and L of each phototransistor are 15 μm, 70 μm, and 20 μm.

To obtain photosignals one by one by scanning each phototransistor, with one gate bus applied with a pulse voltage, the presence or absence of a drain current is detected by applying the pulse voltage to the drain buses one by one in synchronization with it. When the pulse voltage is applied to the n drain buses one by one, the pulse voltage is applied to the next gate bus, and the operation mentioned above is repeated. By doing this, signals can be fetched from all the phototransistors one by one. This operation is called the matrix drive.

Figure 27:
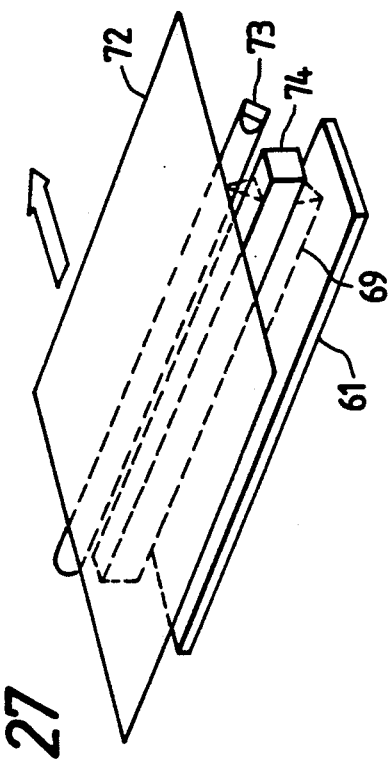
FIG. 27 shows a schematic perspective view of a reader using the one-dimensional photosensor shown in FIGS. 26a to 26c.

FIG. 27 shows a schematic diagram of a reader using the photosensor of this embodiment. Light from light source 73 (a fluorescent lamp, a light emission diode array or the like) is irradiated to manuscript 72, and the reflected light is focused on photosensor substrate 61 like incident light 69 by rod lens array 74, such as a Selfoc lens (trade name of Nippon Itagarasu Kabushiki Kaisha). Manuscript 72 is automatically conveyed and the image information on the manuscript is converted to an electric signal. This configuration may be used as facsimile terminal equipment or an image scanner.

Embodiment 16

Figure 28A:
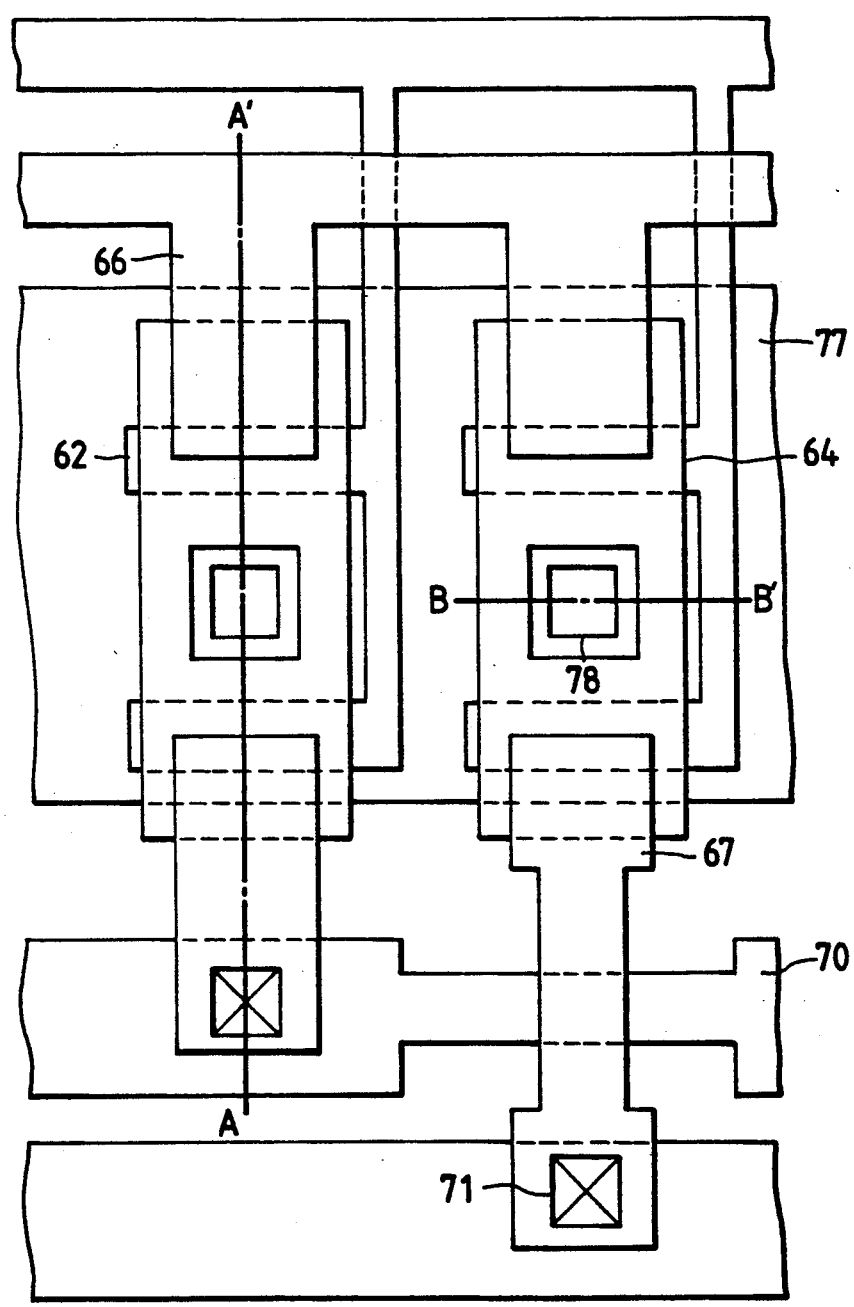
FIGS. 28a, 29, and 30 show the plan views of the picture element regions of one-dimensional contact phototransistors of the embodiments of the present invention.
Figure 28B:
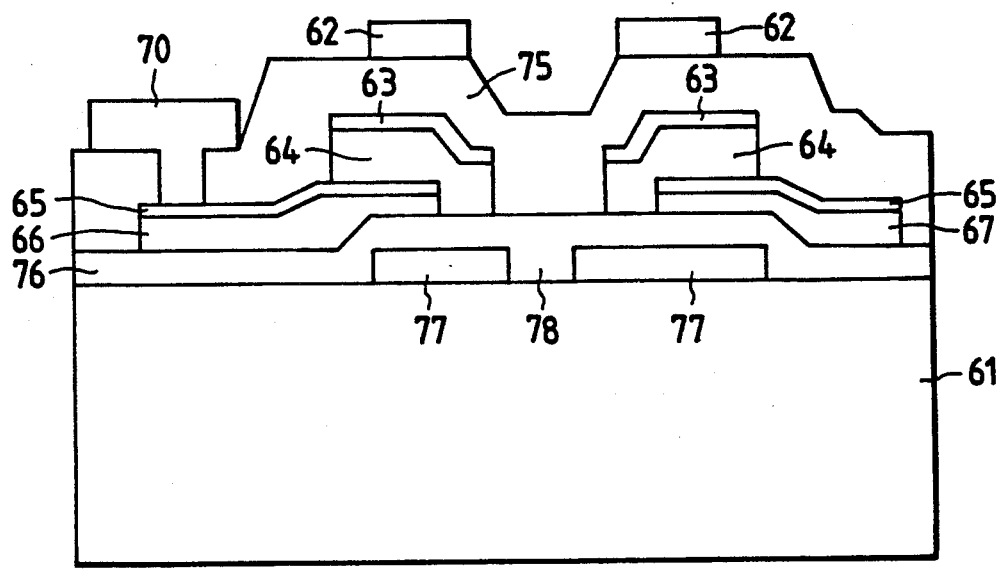
Figure 28C:
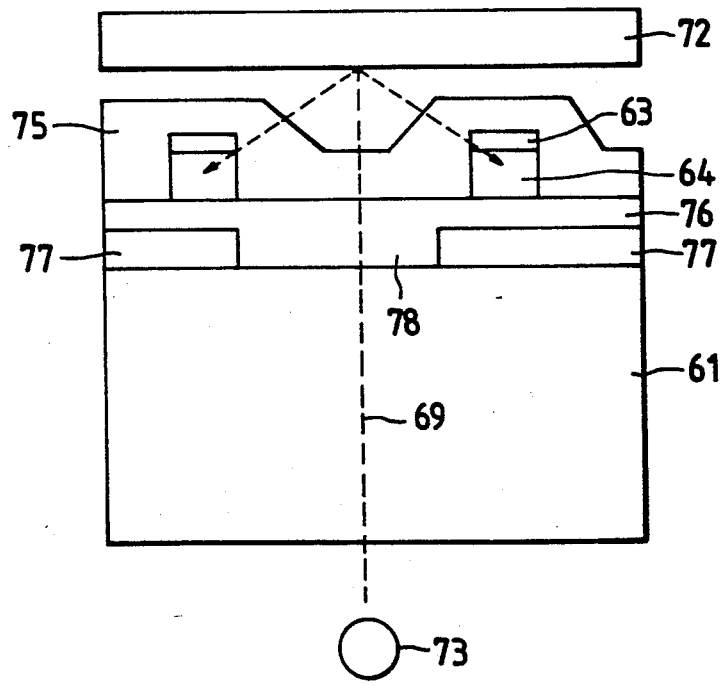

FIGS. 28a to 28c show the configuration diagrams of another embodiment of a one-dimensional contact photosensor of the present invention; that is, FIG. 28a shows the plan view of the picture element region, FIG. 28b shows the A—A' section view of the picture element region in FIG. 28a, and FIG. 28c shows the B—B' section view of the picture element region in FIG. 28a.

A photosensor of this configuration is featured by that it can be used, unlike that in Embodiment 15, without using a rod lens array. As shown in FIG. 28c, light 69 emitted from light source 73 reaches manuscript 72 via window portion 78 in light shield 77 on substrate 61. The reflected light is irradiated to semiconductor layer 64 and generates photocarriers, which are fetched from the drain electrode as a photocurrent of the phototransistor. This configuration allows the so-called perfect contact method to be used.

The forming process for a photosensor of this configuration is as follows: A Cr film is deposited on glass substrate 61 as light shield 77. The film is patterned to make window portion 78 in it, then covered fully with insulating film 76 of silicon dioxide by the CVD method. A Cr film is deposited by the sputtering method, and n a-Si layer 65 is deposited by the plasma CVD method. The layer is patterned to form source electrode 66 and drain electrode 67. Then, intrinsic semiconductor layer 64 of a-Si and silicon nitride film 63 are deposited to form a channel region of the phototransistor. The region of the a-Si layer corresponding to window portion 78 of the light shield should be removed beforehand. Insulating film 75 of silicon nitride is deposited on it once again by the plasma CVD method, and a drain bus line contact hole is formed on the film. Gate electrode 62 is wired by Cr or Al and drain bus 70 is formed last. The surface of the photosensor formed as mentioned above is covered with a insulating film or with a thin glass film (about 100 μm in thickness) using adhesive to protect it.

In the case of a photosensor of this configuration, the optical information of each manuscript can be read by using a mechanical operation in the same way as in Embodiment 15.

Various sensor configurations other than those described in the embodiments of one-dimensional contact photosensors of the present invention mentioned above may be used.

No light shield, for example, is provided in Embodiment 15, a light shield may be installed above protective film 68 in FIG. 26b to minimize the effect of stray light. The window portion of the light shield in Embodiment 16 is square. A rectangular or circular hole may be used as a window portion satisfactorily; that is, an optimum shape can be selected according to the application. The hole as a window portion in the embodiment is located in the center of the semiconductor layer. It may be located anywhere or two holes may be provided on both sides of the semiconductor layer.

Figure 29:
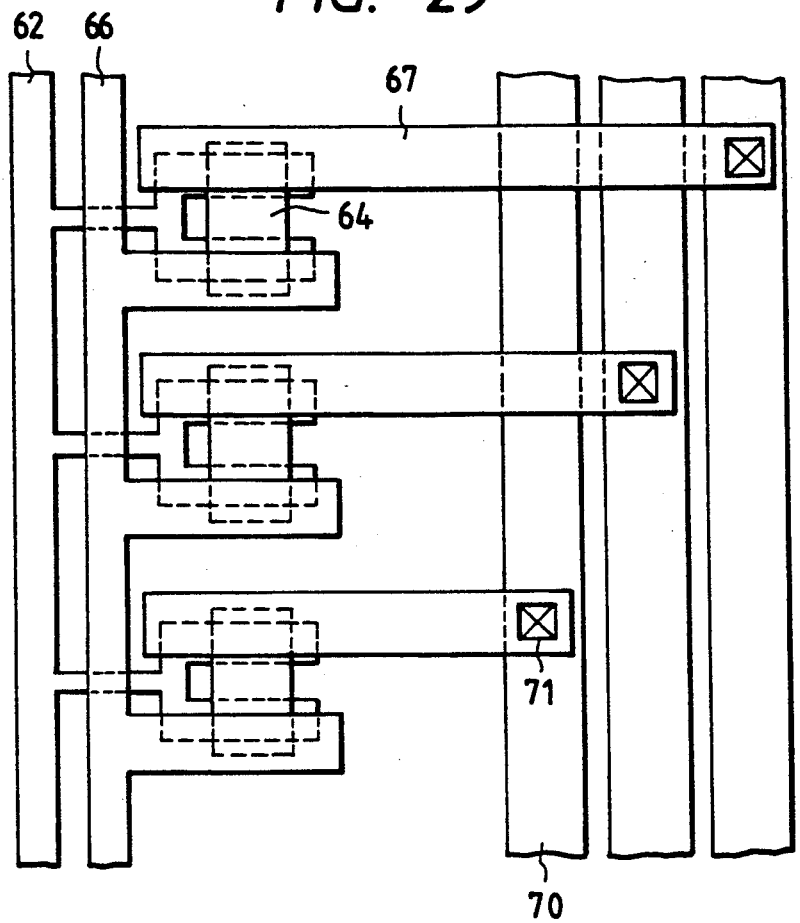
Figure 30:
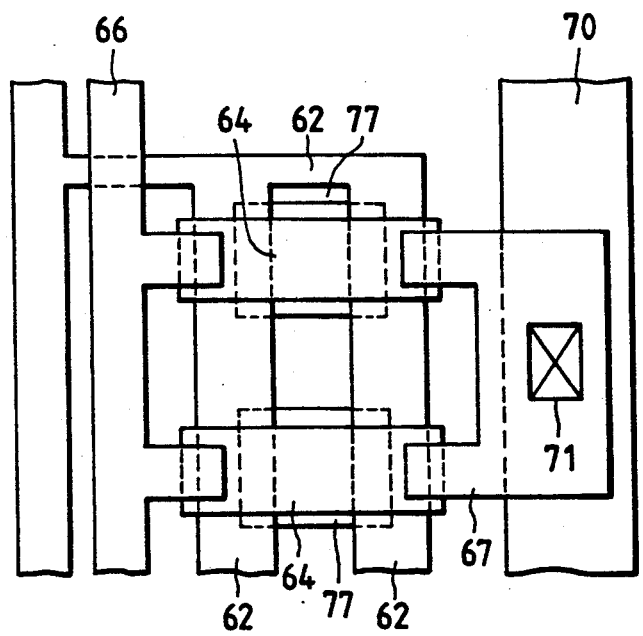

The gate, source, and drain electrodes may be located anywhere other than the locations shown in the embodiment. In FIG. 26a, for example, the source and drain electrodes are located on the left and right of semiconductor region 64 (perpendicular to the bus line). Those electrodes may be located above and under the semiconductor region (parallel with the bus line) as shown in FIG. 29. If this occurs, the location of the gate electrode should be properly changed. The bus lines may be located regardlessly of the arrangement in the embodiment; that is, they may be altered in location or located on one side. The gate of the phototransistor in the embodiment has two branches. A phototransistor provided with one, three, or more gates may be used. As another one of Embodiment 16 in FIGS. 28a to 28c, the semiconductor region may be divided into two parts to introduce light through the gap as shown in FIG. 30.

The gate insulating film is used for insulation of the wire intersection in Embodiment 15. An a-Si:H island may be left at the intersection to decrease the inter-wire short-circuit probability.

Silicon nitride and silicon dioxide are used for the insulating films in the embodiments. Another insulating material such as PIQ may be used as an organic film. An two-layer insulating film may be used; that is, various combinations of two layers are possible. The configuration of one picture element for each phototransistor is used in the embodiments. One picture element may contain one thin film phototransistor and one thin film transistor. This configuration allows the phototransistor to execute the photosensing function and the thin film transistor to execute the switching function, providing improved integrated characteristics of the photosensor. For further details, see the embodiments of two-dimensional photosensors described later.

As mentioned above, by using a photosensor of the configuration of the present invention or a one-dimensional photosensor of the configuration that each picture element comprises a thin film phototransistor as a one-dimensional photosensor, various problems of the conventional technology have been solved. As a result, a one-dimensional contact photosensor of the simplified configuration, which is lensless and lower in price, can be provided. The thin film phototransistor constituting each picture element has a photosensing, a switching, and an amplifying function, so that the complexity of the conventional external drive circuit is extremely minimized, providing a simplified configuration. The number of scanning ICs, for example, is reduced to 1 of several tenths of that by the conventional technology.

The amplifying function of each phototransistor improves the SN ratio extremely compared with that by the conventional photodiode method.

Each same reference numeral in FIGS. 26a to 30 indicates the same item.

Descriptions of the embodiments of two-dimensional photosensor arrays of the present invention follow.

Embodiment 17

Figure 31A:
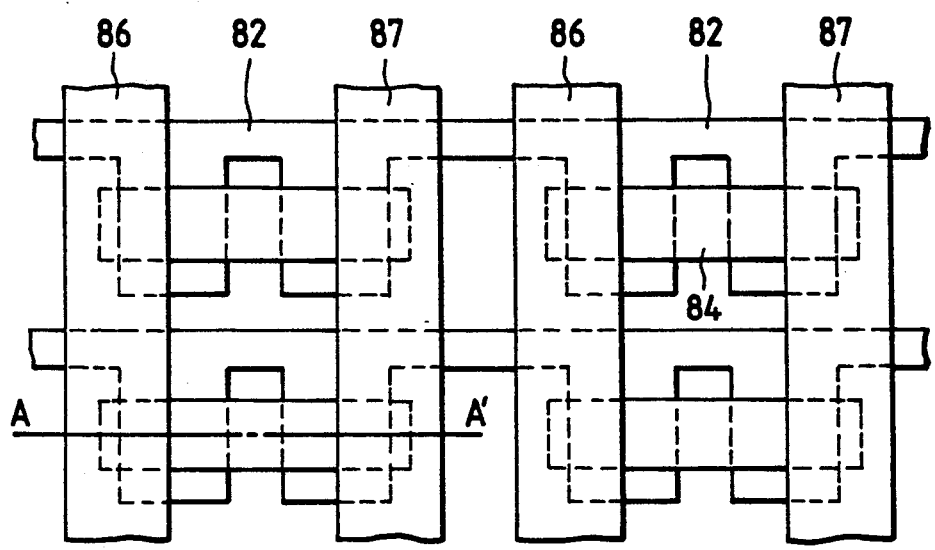
FIGS. 31a to 31b show the plan view (for 4 picture elements) and A—A' section view, respectively, of the picture element region of a two-dimensional photosensor of the embodiment of the present invention and, FIG. 26 shows a circuit diagram of the two-dimensional photosensor mentioned above.
Figure 31B:
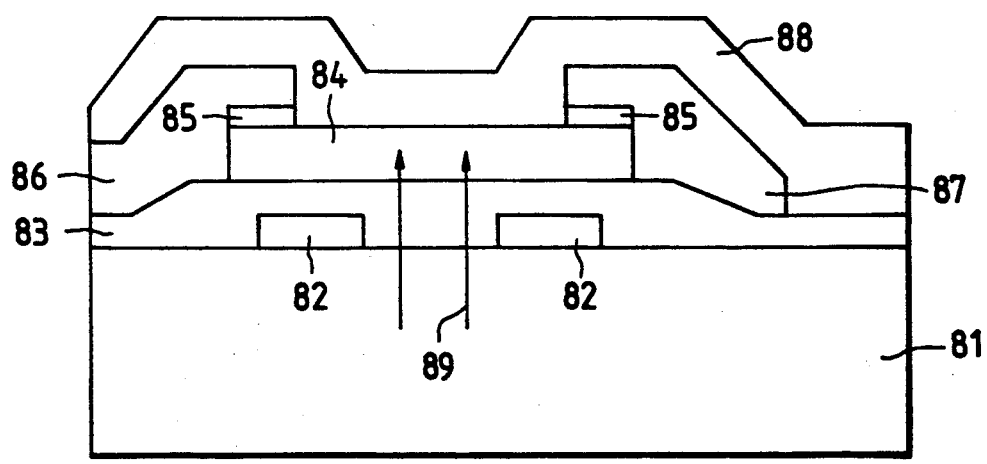
Figure 31C:
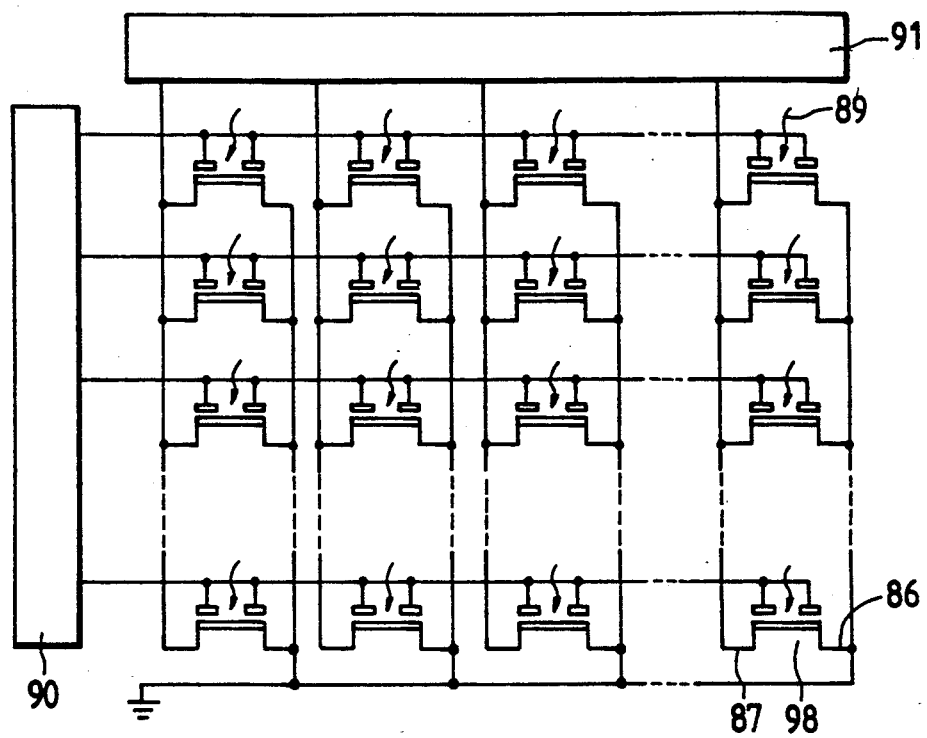

FIG. 31a shows the plan view of the picture element region of a two-dimensional photosensor array of the embodiment, FIG. 31b shows the section view of the picture element region, and FIG. 31c shows the panel configuration wiring diagram.

Descriptions of the sensor substrate manufacturing process follow. Metallic chromium is deposited 200 nm in thickness on glass substrate 81 by the sputtering method, and the film is patterned so that gate 82 is branched to two parts on the transistor region. Silicon nitride 83 for the gate insulating film, a-Si layer 84 as a semiconductor layer, and n a-Si layer 85 as an ohmic contact layer are continuously deposited on it by the plasma CVD method. The semiconductor layer of a-Si of 550 nm in thickness is a layer where photocarriers are generated and a layer, on the interface of which with the SiN film a channel is formed as a current path.

When monosilane 100% or monosilane hydrogen-dilute gas (for example, 10%) is used by the plasma CVD method, an undoped a-Si layer is formed. By introducing phosphine (PH$_3$), a-Si in which an N type impurity of phosphorus is doped is formed. By introducing SiH$_4$ as well as mitrogen and/or ammonia, silicon nitride is formed. By introducing N$_2$O gas, a silicon oxide film is formed. These insulating films are used as a gate insulating film or a protective film. The deposited a-Si layer is patterned to an island as shown in FIGS. 31a and 31b.

The source and drain electrodes are formed at the next step. Two-layer films of Cr and Al are used as an electrode material. Source electrode 86 and drain electrode 87 are formed by patterning. As shown in FIG. 31c, the source electrodes are batched to one electrode. This terminal is generally connected to the grounding terminal. The drain terminals are gathered in a column state and connected to horizontal shift register 91. The terminals may be directly connected to the shift register, though a buffer or circuit with a latch function is often inserted between them. Reference numerals 88 and 89 indicate an insulating film and incident light.

The gate wires are connected to vertical register 90, and they are opened one by one for surface scanning. Each phototransistor 98 at the intersections of the gate and drain wires is a photosensor and a switch device with a switching function. Therefore, when a pulse is applied to one gate wire, the transistor on one line connected to the gate wire is electrically switched on. When a pulse is applied to the drain wires one by one, the photosignal corresponding to the incident light to each phototransistor can be fetched from the drain wires. The pitch between the picture elements is set to 8 picture elements/mm in both horizontal and vertical directions. The pitch may be set to 16 picture elements/mm.

The above is the operation principle of a photosensor with a large area.

Embodiment 18

Figure 32:
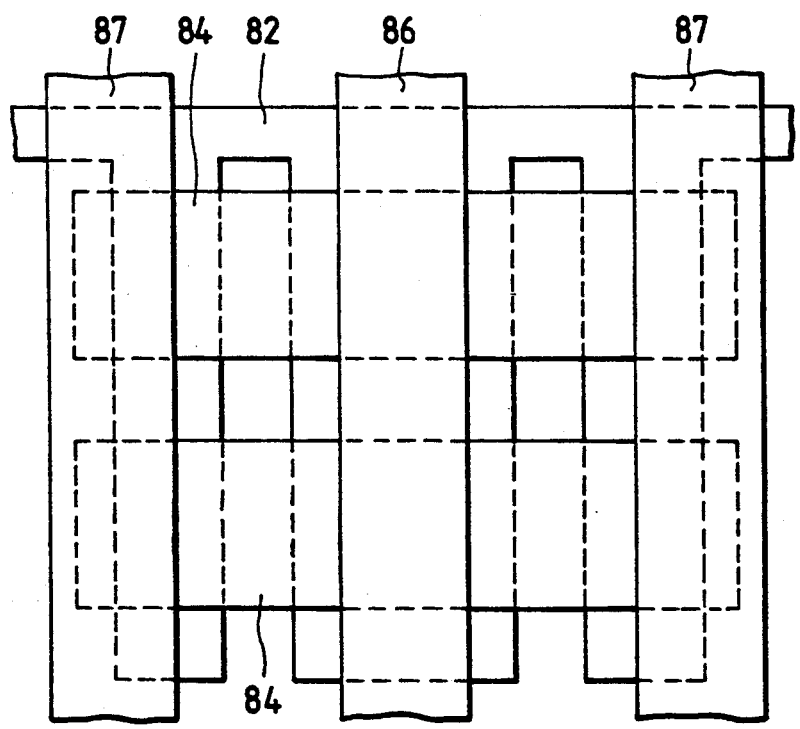
FIG. 32 shows the plan view (for 4 picture elements) of a two-dimensional photosensor of the embodiment of the present invention.

FIG. 32 shows another embodiment of a two-dimensional photosensor array of the present invention. The figure shows the plan view of one picture element of a two-dimensional photosensor. The manufacturing process is the same as that of the embodiment in FIGS. 31a to 31c except the configuration, which differs slightly; that is, only one source electrode is provided and crosses the center of the picture element and the drain wire is divided into two on both sides of the source electrode. The two drain wires are gathered to one finally. The semiconductor region is divided into two islands. Therefore, the picture element region consists of four phototransistors. This configuration is extremely suited to a photosensor by the perfect contact method.

Embodiment 19

Figure 33:
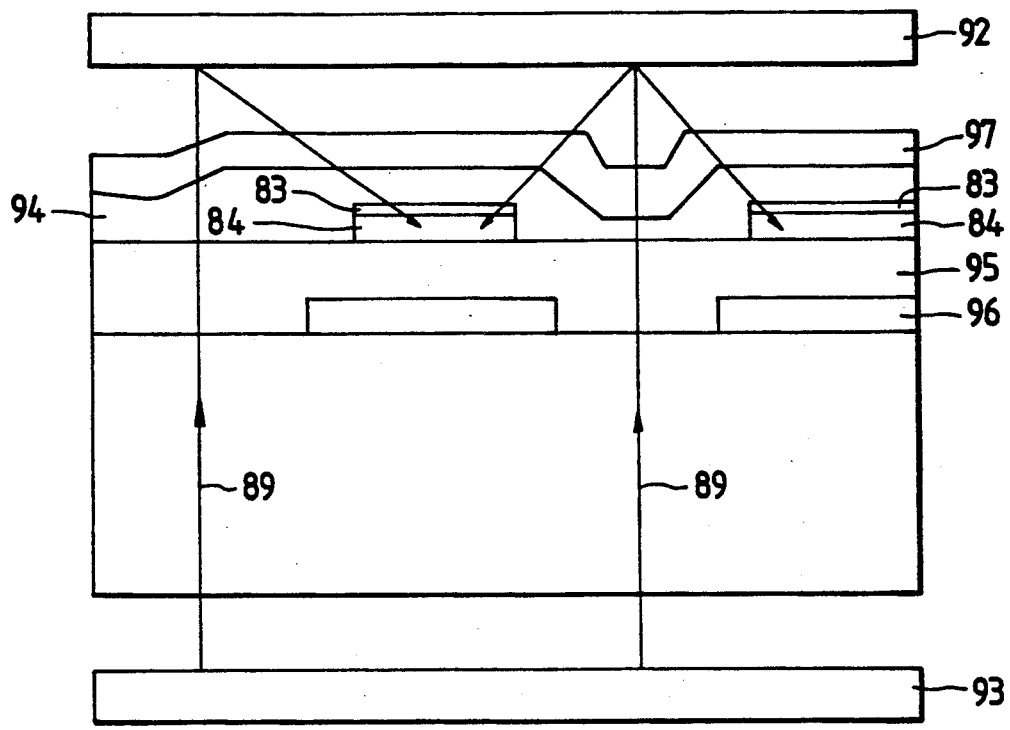
FIG. 33 shows the section view of a two-dimensional photosensor of the embodiment of the present invention.

FIG. 33 shows another embodiment of a two-dimensional photosensor array of the present invention. The photosensor is a contact sensor. A phototransistor array is formed on a glass substrate, and manuscript 92 is placed on the phototransistor array at a fixed gap (50 $\mu$m to 100 $\mu$m). Light source 93 is located on the back of the glass substrate, and light from the back through the gap of light shield region 96 is irradiated to the manuscript. The light reflected off of the manuscript enters the semiconductor region and is absorbed here to generate photocarriers, which apply a voltage to the gate and drain electrodes to be read as a photosignal.

Figure 34:
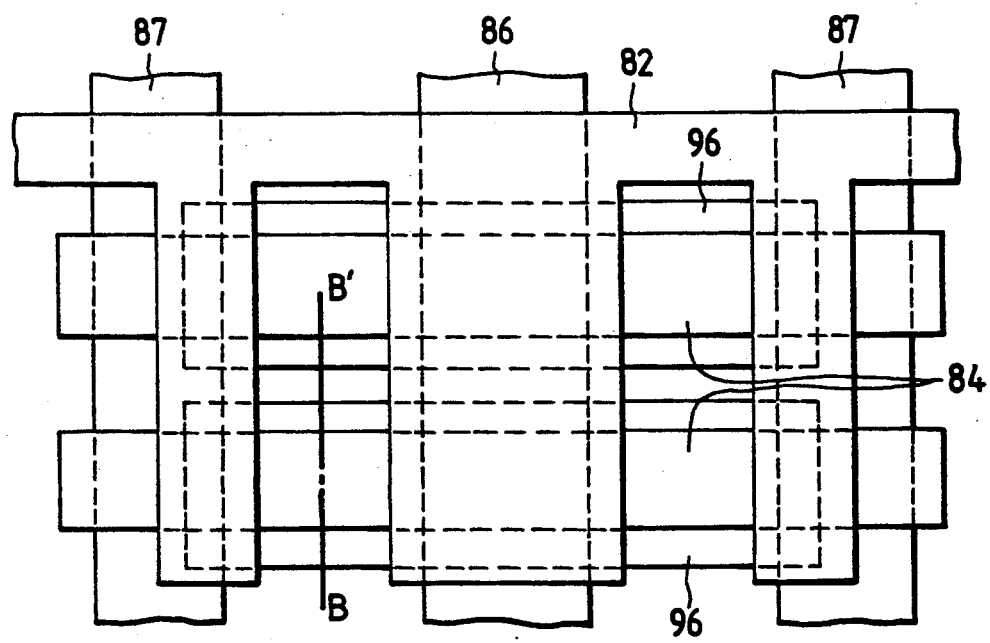
FIG. 34 shows the plan view of the two-dimensional photosensor shown in FIG. 33.

The phototransistor manufacturing process is opposite to that in Embodiment 17. Cr is deposited 150 nm in thickness on a glass substrate, and the film is patterned to form light shield 96. An insulating film is deposited on it to separate it electrically. The source and drain electrodes are formed at the next step. Each electrode consists of a two-layer film of Cr and n a-Si. The n a-Si layer is used as an ohmic contact layer. After patterning, an a-Si i layer and a gate insulating layer of SiN are deposited on it and patterned to islands as shown in FIG. 34. Gate insulating film 94 is deposited, then a gate metal is deposited and patterned. SiN film 97 is deposited as a protective film last.

As shown in FIG. 34 (FIG. 34 corresponds to one picture element and the B—B' section view corresponds to FIG. 33), one picture element comprises four phototransistors, and the phototransistors are all connected to the source electrode crossing the center of the picture element. The drain electrodes are arranged on both sides, and electric signals of the four phototransistors are added and handled as a signal of one picture element. Two phototransistors may be connected to each other to produce two pairs, and an independent signal may be externally fetched from each drain wire. If this occurs, the resolution in the transverse direction is doubled.

The reason for each picture element being divided by four is to fetch a photosignal in an even shape in the picture element. The light from the light source reaches the manuscript through the window portion of the light shield and the gaps between gate and drain wires, is reflected off of the manuscript, and absorbed into the semiconductor layer. The region through which the light passes and the semiconductor region should be designed optimally. It is desirable that the ratio of the two region areas is not so large. A ratio of close to 1 is effectual. The ratio depends on the light intensity, the reflection factor of the manuscript, and the photosensitivity. The desired ratio ranges from ½ to 2.

The photosignals gathered as mentioned above are externally output one by one by the vertical and horizontal shift registers as shown in FIG. 31c. The scanning method may be line or dot sequential. A latch or buffer circuit may be installed as required. The scanning circuit may be external ICs or may be incorporated on the glass substrate. When the scanning circuit is external ICs, an IC chip is installed by the tape automated bonding (TAB) method or the chip on glass (COG) method. A scanning circuit of a thin film transistor of a-Si or a polycrystalline silicon transistor may be incorporated on the glass substrate in the same way as that of a phototransistor. A thin film transistor and an IC chip may be used together.

This sensor array can be used in various equipment. A color image (JIS A4 in size) data input unit has been produced by way of trial to check characteristics. To input color information, three color (red, green, and blue) filters are installed on the sensor in delta arrangement. By doing this, the reproducibility of color information is improved. This filter arrangement is the same as that of a liquid crystal display to be driven by an a-Si thin film transistor so that the input image information can be reproduced on the display. The input color image reading time is 0.5 seconds.

Embodiment 20

Figure 35A:
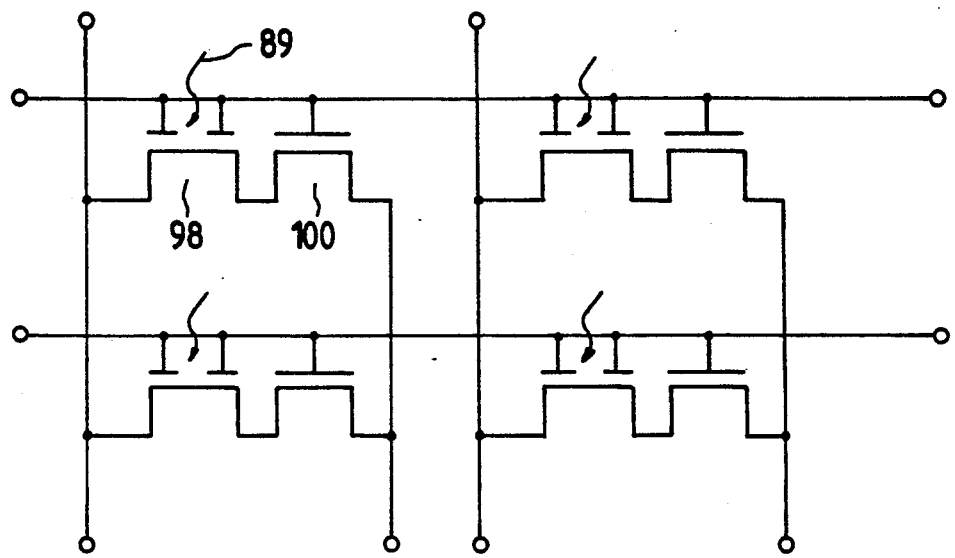
FIGS. 35a and 35b show equivalent circuit diagrams of the picture element regions of two-dimensional photosensors of the embodiments of the present invention.
Figure 35B:
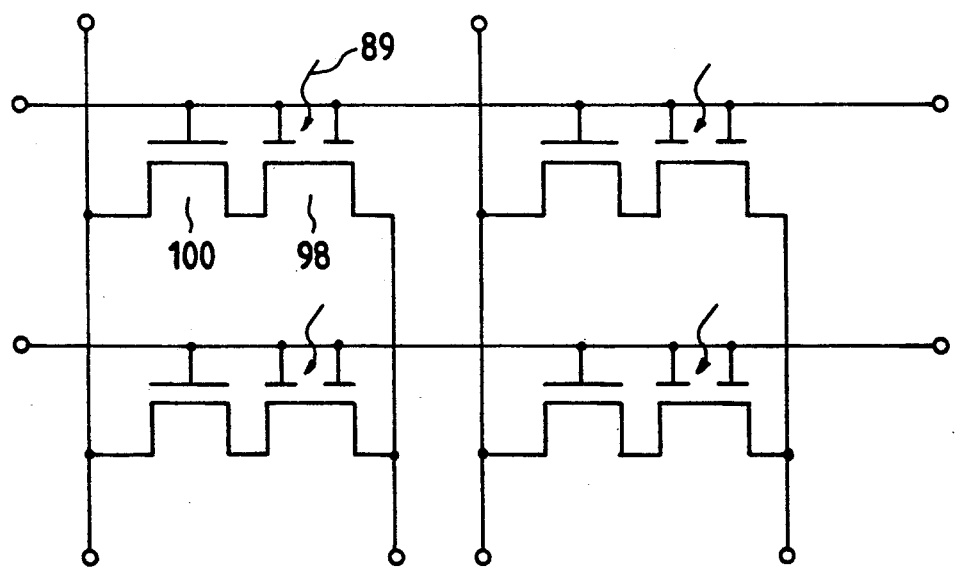
Figure 36:
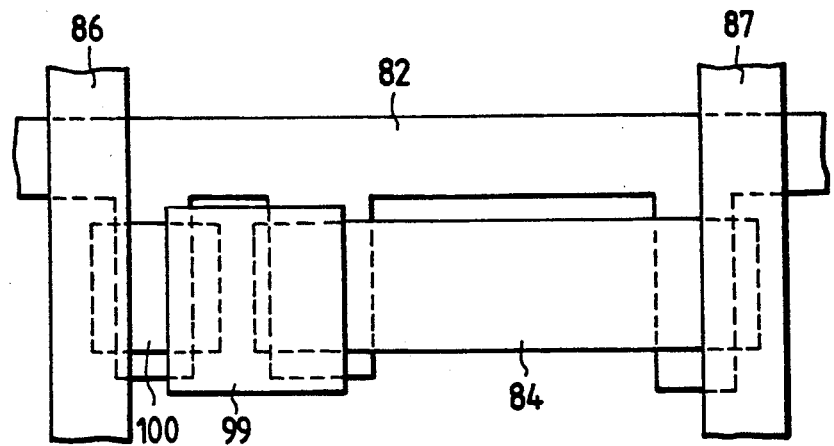
Figure 37:
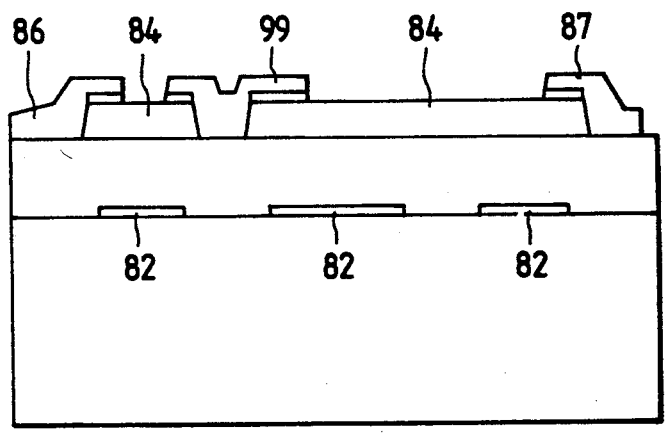

FIGS. 35a and 35b show another embodiments of two-dimensional photosensor arrays of the present invention. The figures show 4 picture elements in the array. Each picture element comprises phototransistor 98 and thin film transistor (TFT) 100 as a switch. FIGS. 35a and 35b are different in the TFT connection position but equal in the function. The scanning method is the same as that in the previous embodiment. FIG. 36 shows the plan view of the picture element region equivalent to that in FIG. 35a, and FIG. 37 shows the section view of the picture element region. FIG. 37 shows that each thin film transistor (TFT) and phototransistor are made of amorphous silicon and there is no difference in the number of processes between them but some differences in the gate shape and electrode configuration. The gates of the two (thin film transistor and phototransistor) are connected to the same gate bus. TFT gate wires may be provided independently of the phototransistor. Reference numeral 99 indicates an electrode.

Embodiment 21

Figure 38:
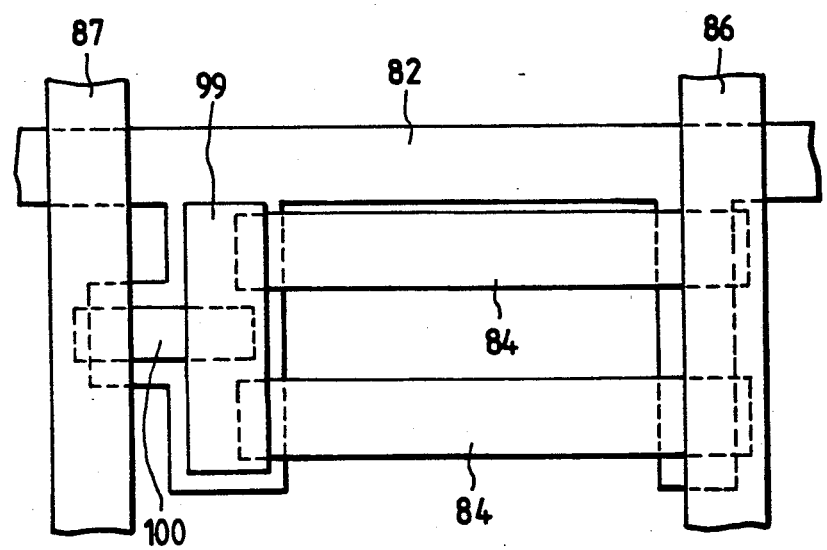
FIGS. 38 to 40 show the plan views of two-dimensional photosensors of the embodiments of the present invention.

FIG. 38 shows the configuration of another embodiment of a two-dimensional photosensor array of the present invention. The picture element region comprises two phototransistors and a thin film transistor (TFT) which switches the phototransistors. The ratio (W/L) of the TFT channel width to the channel length can be made high (L is decreased), so that the thin film transistor may be smaller in size than the phototransistors. The relationship between the source and drain electrodes in this embodiment corresponds to that in FIG. 35b.

Embodiment 22

Figure 39:
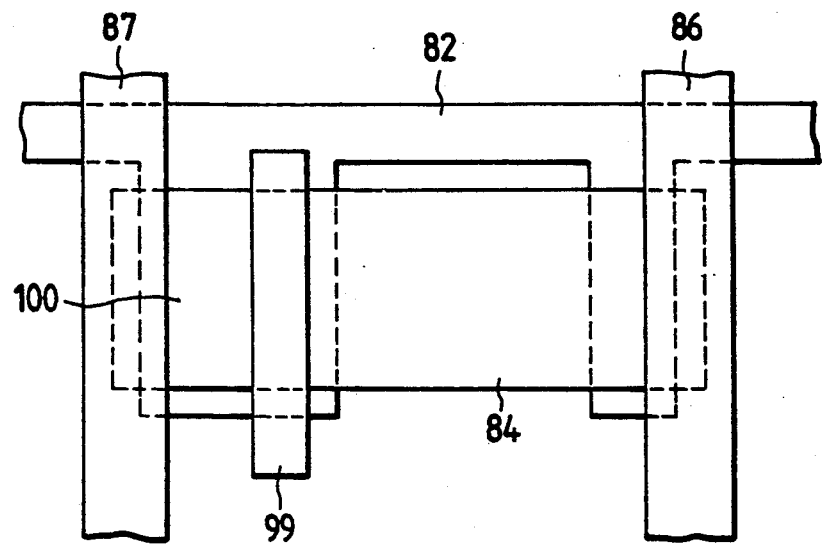

FIG. 39 shows another embodiment of a two-dimensional photosensor array of the present invention. The amorphous silicon islands are not separated, and the phototransistor is separated from the thin film transistor by electrode 99.

In this embodiment, the material of the thin film transistor is the same as that of the phototransistor. However, another configuration or material may be used. The materials of the two may be different from each other.

Figure 40:
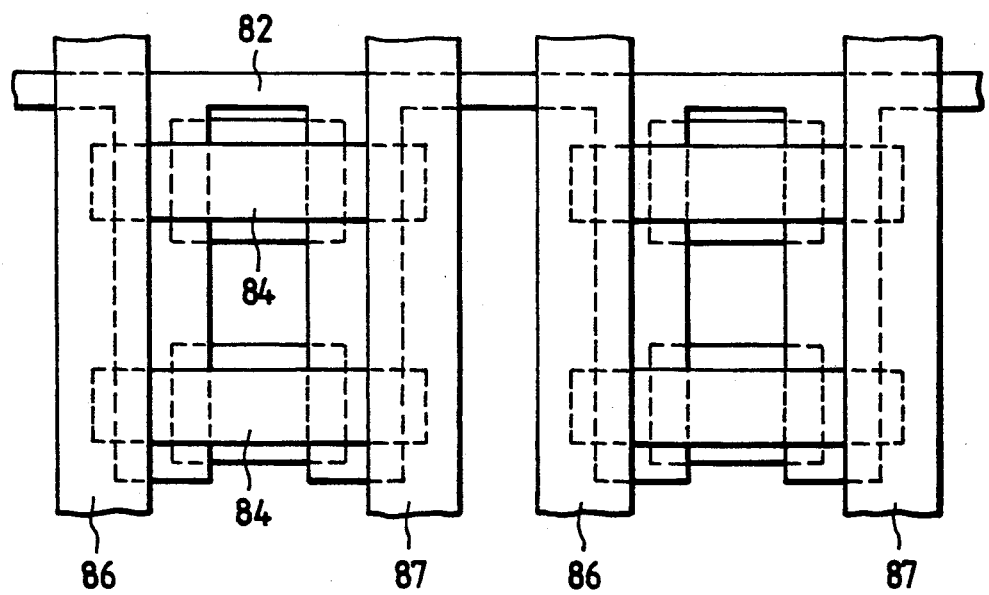

Another configuration, material, and process other than those (only a few examples are shown) in the embodiments of two-dimensional photosensor arrays of the present invention mentioned above may be used. In the embodiments, each gate has two branches. The number of branches may be one. The semiconductor region is divided by 4 in the embodiments. It may be divided by 2 or 3 as shown in FIG. 40.

The material of each light shield is a metal, that of each semiconductor layer is a-Si, and that of each insulating film is an inorganic substance (such as SiN) in the embodiments. Another substances may be used; that is, (1) the insulating films and light shields may be organic films, (2) the semiconductor layers may be compound, or Si, and (3) the insulating films may be made of an amorphous alloy, a group II-V or III-V made of an oxide such as $SiO_2$ or $Al_2O_3$, or a combination of inorganic and organic films or a combination of inorganic films.

A manufacturing process that a gate, gate insulating film, semiconductor layer, and protective film are deposited on a glass substrate, then the protective film is removed and an ohmic contact layer and a metal are deposited may be used to produce a sensor array. Each same reference numeral in FIGS. 31a to 40 indicates the same item.

A phototransistor constituting each picture element of the present invention has a photosensing, a switching, and an amplifying function, so that a two-dimensional photosensor array, which cannot be produced by the conventional technology, can be easily produced. This sensor converts image information electronically to an electric signal at a high speed, and facilitates color image input by a combination of color filters.

A combination of phototransistors and thin film transistors constituting each picture element suppresses a leak current from a non-selective picture element or crosstalk, or increases the SN ratio. It produces satisfactory results when hundreds of thousands or millions picture elements are used in an array. When the material of each thin film transistor is the same as that of each phototransistor, such as amorphous silicon, the process is simplified and the cost is reduced.

The equipment may be reduced in thickness due to no mechanical scanning.

When amorphous silicon is used for photosensitive semiconductor layers, a two-dimensional photosensor array, which is featured by high sensitivity, a large area, a low temperature process high performance, and a low price, may be produced.

A window portion on each substrate provides a perfect contact photosensor array or a two-dimensional image input unit requiring no special optical system, producing satisfactory results such as realization of thin equipment lower in price.

What is claimed is:

1. A thin film phototransistor including an arrangement to reduce dark current and comprising a field effect transistor including a source electrode, a drain electrode, a gate electrode, a gate insulating film, and a semiconductor layer, wherein there is a gap between one projection of said gate electrode and another projection of at least one of said source electrode and said drain electrode, said one projection and said another projection being obtained by projecting said gate electrode and said at least one of said source electrode and said drain electrode perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gate electrode but no light is applied.

2. A thin film phototransistor according to claim 1, wherein said gap has a length of at least 1 $\mu$m.

3. The thin film phototransistor according to claim 11 wherein the semiconductor layer is made of hydrogenated amorphous silicon.

4. The thin film phototransistor according to claim 1 wherein, wherein voltages of the source electrode, drain electrode, and gate electrode are Vs, Vd, and Vg respectively, a photoelectric conversion operation is performed in the region of Vs Vd and Vs Vg.

5. The thin film phototransistor according to claim 1, wherein said gate insulating film and said semiconductor layer intervene between said gate electrode and the source and drain electrodes, and wherein incident light is irradiated from a gate electrode side of said field effect transistor.

6. The thin film phototransistor according to claim 5, wherein said incident light is irradiated to a part of said semiconductor layer corresponding to a region where said gap exists between the projection of said gate electrode and the projection of said source electrode and is irradiated to another part of said semiconductor layer overlapped with the projection of said source electrode.

7. A thin film phototransistor including an arrangement to reduce dark current and comprising a field effect transistor including a source electrode, a drain electrode, at least two gate electrodes, a gate insulating film, and a semiconductor layer, wherein there is a gap between projections of said gate electrodes obtained by projecting said gate electrodes perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gate electrode but no light is applied.

8. A thin film phototransistor according to claim 7, wherein said gap has a length of at least 1 $\mu$m.

9. The thin film phototransistor according to claim 7, wherein said gate insulating film and said semiconductor layer intervene between said at least two gate electrodes and the source and drain electrodes, and wherein incident light is irradiated from a gate electrode side of said field effect transistor.

10. The thin film phototransistor according to claim 7 wherein said at least two gate electrodes are connected together in common.

11. The thin film phototransistor according to claim 7 wherein said phototransistor includes means to apply the same voltage or different voltages to the at least two gate electrodes.

12. The thin film phototransistor according to claim 7 wherein the semiconductor layer is made of hydrogenated amorphous silicon.

13. A thin film phototransistor including an arrangement to reduce dark current and comprising a field effect transistor including a source electrode, a drain electrode, at least one gate electrode, a gate insulating film and a semiconductor layer, wherein there is a gap between one projection of at least one end of said at least one gate electrode and another projection of an electrode neighboring said at least one end, said one projection and said another projection being obtained by projecting said at least one end and said electrode neighboring said at least one end perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gage electrode but no light is applied.

14. A thin film phototransistor according to claim 13, wherein said group has a length of at least 1 μm.

15. The thin film phototransistor according to claim 13 wherein at least one of the source electrode, the drain electrode and the gate electrode is transparent.

16. A thin film phototransistor including an arrangement to reduce dark current and comprising a field effect transistor including a source electrode, a drain electrode, a gate electrode, a gate insulating film and a semiconductor layer, wherein there is a gap between one projection of said gate electrode and another projection of at least one of said source electrode and said drain electrode, said one projection and said another projection being obtained by projecting said gate electrode and at least one of said source electrode and said drain electrode perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gate electrode but no light is applied, and wherein at least one of said source electrode, said drain electrode and said gate electrode is transparent.

17. A thin film phototransistor according to claim 16, wherein said gap has a length of at least 1 μm.

18. The thin film phototransistor according to claim 16 wherein the source electrode, the drain electrode, and the gate electrode are formed substantially on the same plane.

19. The thin film phototransistor according to claim 16 wherein the transparent electrode is made of indium-tin oxide.

20. The thin film phototransistor according to claim 16 wherein the semiconductor layer is made of hydrogenated amorphous silicon.

21. The thin film phototransistor according to claim 20 wherein the transparent electrode is an interface reaction layer of metal and hydrogenated amorphous silicon.

22. The thin film phototransistor according to claim 21 wherein the metal contains at least one selected from the group consisting of Cr, Mo, W, Ti, Ta, V, Zr, Nb, Hf, Ni, and Cu.

23. A one-dimensional photosensor array including an arrangement to reduce dark current and characterized in that a one-dimensional photosensor comprising picture elements is arranged on a substrate, wherein each picture element includes a thin film phototransistor comprising a field effect transistor including a source electrode, a drain electrode, at least one gate electrode, a gate insulating film and a semiconductor layer, wherein there is a gap between one projection of at least one end of said at least one gate electrode and another projection of an electrode neighboring said at least one end, said one projection and said another projection being obtained by projecting said at least one end and said electrode neighboring said at least one end perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gage electrode but no light is applied.

24. A one-dimensional photosensor array according to claim 23, wherein said gap has a length of at least 1 μm.

25. The one-dimensional photosensor array according to claim 23, wherein the gate and drain electrodes of the phototransistors constituting the picture elements are grouped and are wired together for each group, and wherein the picture elements are addressed one by one by matrix drive.

26. The one-dimensional photosensor array according to claim 23 wherein the semiconductor layer of the thin film phototransistor is made of amorphous silicon.

27. The one-dimensional photosensor array according to claim 23 wherein a hole region, through which light from the light source is irradiated, is provided on the substrate and the reflected light from a manuscript is directly received by the thin film phototransistor.

28. Facsimile terminal equipment using a one-dimensional contact photosensor as a sensor characterized in that the photosensor includes an arrangement to reduce dark current and comprises picture elements, comprised of thin film phototransistors, arranged on a substrate, wherein each thin film phototransistor comprises a field effect transistor including a source electrode, a drain electrode, at least one gate electrode, a gate insulating film and a semiconductor layer, wherein there is a gap between one projection of at least one end of said at least one gate electrode and another projection of an electrode neighboring said at least one end, said one projection and said another projection being obtained by projecting said at least one end and said electrode neighboring said at least one perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gate electrode but no light is applied.

29. Facsimile terminal equipment according to claim 28, wherein said gap has a length of at least 1 μm.

30. An image scanner using a one-dimensional contact photosensor as a sensor characterized in that the photosensor includes an arrangement to reduce dark current and comprises picture elements, comprised of thin film phototransistors, arranged on a substrate, wherein each thin film phototransistor comprises a field effect transistor including a source electrode, a drain electrode, at least one gate electrode, a gate insulating film and a semiconductor layer, wherein there is a gap between one projection of at least one end of said at least one gate electrode and another projection of an electrode neighboring said at least one end, said one projection and said another projection being obtained by projecting said at least one end and said electrode neighboring said at least one end perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gate electrode but no light is applied.

31. An image scanner according to claim 30, wherein said gap has a length of at least 1 μm.

32. A two-dimensional photosensor array including an arrangement to reduce dark current and comprising photosensors arranged on a substrate characterized in that each picture element of the photosensors comprises at least one thin film phototransistor, a field effect transistor including a source electrode, a drain electrode, at least one gate electrode, a gate insulating film and a semiconductor layer, wherein there is a gap between one projection of at least one end of said at least one gate electrode and another projection of an electrode neighboring said at least one end, said one projection and said another projecting being obtained by projecting said at least one end and said electrode neighboring said at least one end perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gate electrode but no light is applied.

33. A two-dimensional photosensor array according to claim 25, wherein said gap has a length of at least 1 μm.

34. A two-dimensional photosensor array according to claim 32 wherein a hole region, through which light from the light source is irradiated, is provided on the substrate and the reflected light from a manuscript is directly received by the phototransistor.

35. A two-dimensional photosensor array according to claim 32, wherein said each picture element is provided with an additional thin film transistor for switching said thin film phototransistor.

36. A two-dimensional photosensor array according to claim 35, wherein said semiconductor layer of said thin film phototransistor is comprised of amorphous silicon, and wherein said thin film transistor for switching is a field effect transistor employing amorphous silicon.

37. An image data input unit using a two-dimensional photosensor array as an input unit characterized in that the two-dimensional photosensor array includes an arrangement to reduce dark current and comprises photosensors arranged on a substrate, wherein each picture element of the photosensors comprises at least one thin film phototransistor, a field effect transistor including a source electrode, a drain electrode, at least one gate electrode, a gate insulating film and a semiconductor layer, wherein there is a gap between one projection of at least one end of said at least one gate electrode and another projection of an electrode neighboring said at least one end, said one projection said at least one end and said electrode neighboring said at least one end perpendicularly onto a plane which is parallel with said semiconductor layer to reduce dark current to thereby increase a ratio between photocurrent that flows when light is applied and a predetermined voltage is applied to the gate electrode and dark current that flows when the same predetermined voltage is applied to the gate electrode but no light is applied.

38. An image data input unit according to claim 37, wherein said gap has a length of at least 1 μm.

39. A thin film phototransistor including an arrangement to reduce dark current and comprising a field effect transistor including a source electrode, a drain electrode, at least one gate electrode, a gate insulating film and a semiconductor layer, wherein said at least one gate electrode is separated from at least one of said source and drain electrodes in both a vertical direction which is substantially perpendicular to said semiconductor layer and in a horizontal direction which is substantially parallel to said semiconductor layer to reduce dark current to thereby increases a ratio between photocurrent that flow when light is applied and a predetermined voltage is applied to the gate electrode and dark current that flows when the same predetermined voltage is applied to the gate electrode but no light is applied.

40. A thin film phototransistor according to claim 39, wherein the other of said source and drain electrode is separated from said at least one gate electrode in said vertical direction but overlaps said at least one gate electrode in said horizontal direction.

41. A thin film phototransistor according to claim 39, wherein both of said source and drain electrodes are separated from said at least one gate electrode in said vertical and horizontal directions.

42. A thin film phototransistor according to claim 39, wherein said gate insulating film and said semiconductor layer are located between said at least one gate electrode and said source and drain electrodes in said vertical direction, and wherein said phototransistor is arranged to operate based on incident light impinging on said phototransistor from a gate electrode side of said phototransistor.

43. A thin film phototransistor according to claim 42, wherein said at least one gate electrode and said at least one of said source and drain regions are separated from one another in said horizontal direction by a gap which is at least 1 μm.

44. A thin film phototransistor according to claim 43, wherein the other of said source and drain electrodes is separated from said at least one gate electrode in said vertical direction but overlaps said at least one gate electrode in said horizontal direction.

45. A thin film phototransistor according to claim 43, wherein both of said source and drain electrodes are separated from said at least one gate electrode in said vertical and horizontal directions.

46. A thin film phototransistor according to claim 39, wherein said at least one gate electrode and said at least one of said source and drain regions are separated from one another in said horizontal direction by a gap which is at least 1 μm.

47. A thin film phototransistor according to claim 46, wherein the other of said source and drain electrodes is separated from said at least one gate electrode in said vertical direction but overlaps said overlaps said at least one gate electrode in said horizontal direction.

48. A thin film phototransistor according to claim 46, wherein both of said source and drain electrodes are separated from said at least one gate electrode in said vertical and horizontal directions.

49. A thin film phototransistor including an arrangement to reduce dark current and comprising a field effect transistor including a source electrode, a drain electrode, at least one gate electrode, a gate insulating film and a semiconductor layer, wherein said field effect transistor includes a channel formed in said semiconductor layer between said source electrode and said drain electrode, wherein a first portion of said channel is formed in a first region of said semiconductor layer which is overlapped by said gate electrode, said first portion of said channel being formed when a voltage is applied to said gate electrode, and wherein a second portion of said channel is formed in a second region of said semiconductor layer which is not overlapped by said gate electrode but is arranged so that it can be exposed to light so that said second portion of said channel is formed when light strikes said second region of said semiconductor layer, and wherein said second region of said semiconductor layer has a predetermined high resistance when light does not strike said second region to reduce dark current to thereby increase a ratio between photocurrent and dark current, wherein the photocurrent flows when light is applied to the second region of the semiconductor layer and a predetermined voltage is applied to the gate electrode, and wherein the dark current flows when the same predetermined voltage is applied to the gate electrode but no light is applied to the second region of the semiconductor layer.

50. A thin film phototransistor according to claim 49, wherein said second region of said semiconductor layer has a length of at least 1 μm.

51. A thin film phototransistor according to claim 49, wherein said second region of said semiconductor layer is directly in contact with said first region of said semiconductor layer.

52. A thin film phototransistor according to claim 51, wherein said second region of said semiconductor layer has a length of at least 1 μm.

* * * * *